United States Patent
Dai

(10) Patent No.: US 9,793,885 B2
(45) Date of Patent: *Oct. 17, 2017

(54) METHOD AND APPARATUS FOR AN ACTIVE NEGATIVE-CAPACITOR CIRCUIT TO CANCEL THE INPUT CAPACITANCE OF COMPARATORS

(71) Applicant: Tensorcom, Inc., Carlsbad, CA (US)

(72) Inventor: Dai Dai, Carlsbad, CA (US)

(73) Assignee: Tensorcom, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/340,430

(22) Filed: Nov. 1, 2016

(65) Prior Publication Data
US 2017/0063362 A1    Mar. 2, 2017

Related U.S. Application Data

(63) Continuation of application No. 14/995,471, filed on Jan. 14, 2016, now Pat. No. 9,484,941, which is a
(Continued)

(51) Int. Cl.
*H03M 1/34* (2006.01)
*H03K 5/24* (2006.01)
(Continued)

(52) U.S. Cl.
CPC ......... *H03K 5/2481* (2013.01); *H03H 11/481* (2013.01); *H03M 1/002* (2013.01);
(Continued)

(58) Field of Classification Search
CPC ... H03K 5/2481; H03H 11/481; H03M 1/002; H03M 1/0845; H03M 1/183
(Continued)

(56) References Cited

U.S. PATENT DOCUMENTS

| | | | |
|---|---|---|---|
| 5,558,477 A * | 9/1996 | Browning | F16F 15/005 188/380 |
| 6,264,056 B1 * | 7/2001 | King | E03C 1/20 206/518 |

(Continued)

FOREIGN PATENT DOCUMENTS

| | | |
|---|---|---|
| JP | 06342561 | 12/1994 |
| JP | 2000114941 | 4/2000 |

(Continued)

OTHER PUBLICATIONS

Code of Federal Reg Title 47—Telecom Chapter 1—FCC Subchapter A—General.

*Primary Examiner* — Lam T Mai
(74) *Attorney, Agent, or Firm* — Steven J Shattil

(57) ABSTRACT

A circuit comprises a first amplifier coupled to a first and a second node; a differential capacitive load coupled to the first and the second node, the differential capacitive load coupled between drains of transistors in a cross coupled transistor circuit; a current mirror coupled to a source of each transistor; and a capacitor coupled between the sources of the transistors. A plurality of amplifiers can be coupled to the differential capacitive load, wherein each amplifier comprises a clock-less pre-amplifier of a comparator. The amplifiers may be abutted to one another such that an active transistor of a first differential stage in a first amplifier behaves as a dummy transistor for an adjacent differential stage in a second amplifier.

6 Claims, 11 Drawing Sheets

Related U.S. Application Data continuation of application No. 14/672,214, filed on Mar. 29, 2015, now Pat. No. 9,264,056, which is a continuation of application No. 13/602,216, filed on Sep. 3, 2012, now Pat. No. 9,124,279.

(51) Int. Cl.
  *H03H 11/48* (2006.01)
  *H03M 1/00* (2006.01)
  *H03M 1/08* (2006.01)
  *H03M 1/18* (2006.01)

(52) U.S. Cl.
  CPC ......... *H03M 1/0845* (2013.01); *H03M 1/183* (2013.01); *H03M 1/0836* (2013.01)

(58) Field of Classification Search
  USPC .................................. 341/158; 333/213–216
  See application file for complete search history.

(56) References Cited

U.S. PATENT DOCUMENTS

| | | | | |
|---|---|---|---|---|
| 6,504,499 B1 * | 1/2003 | Masenas | ............. | H03M 1/0682 327/52 |
| 6,885,222 B2 | 4/2005 | Sato | | |
| 6,886,222 B2 * | 5/2005 | Vitry | ....................... | E05B 77/04 16/349 |
| 6,943,633 B2 * | 9/2005 | Singh | .................. | H03K 3/0315 327/264 |
| 7,202,762 B2 * | 4/2007 | Luh | .......................... | H03H 7/03 333/213 |
| 7,573,332 B1 * | 8/2009 | Kase | ................... | H03F 3/45183 330/253 |
| 7,807,077 B2 * | 10/2010 | Hochsmann | ........ | B29C 67/0081 164/15 |
| 7,817,077 B2 | 10/2010 | Miyashita | | |
| 7,852,174 B2 | 12/2010 | Cathelin et al. | | |
| 7,880,568 B2 | 2/2011 | Amin et al. | | |
| 8,198,920 B2 | 6/2012 | Chatal | | |
| 8,248,108 B2 | 8/2012 | Santoro et al. | | |
| 8,339,198 B2 | 12/2012 | Mole et al. | | |
| 8,717,300 B2 * | 5/2014 | Kishi | ................... | G09G 3/3233 345/172 |
| 8,872,587 B2 * | 10/2014 | Cheeranthodi | ......... | H03F 1/086 330/252 |
| 9,124,279 B2 * | 9/2015 | Dai | ...................... | H03H 11/481 |
| 9,264,056 B2 * | 2/2016 | Dai | ...................... | H03H 11/481 |
| 9,484,941 B2 * | 11/2016 | Dai | ...................... | H03H 11/481 |
| 2005/0156681 A1 | 7/2005 | Takinami et al. | | |
| 2005/0179497 A1 | 8/2005 | Sobel | | |
| 2006/0132236 A1 | 6/2006 | Kim | | |
| 2007/0080748 A1 | 4/2007 | Giatis et al. | | |
| 2008/0048731 A1 | 2/2008 | Huang | | |
| 2009/0102571 A1 | 4/2009 | Park et al. | | |
| 2010/0148878 A1 | 6/2010 | Kapusta | | |
| 2010/0164770 A1 | 7/2010 | Wan et al. | | |
| 2012/0220255 A1 | 8/2012 | Khoini Poorfard | | |

FOREIGN PATENT DOCUMENTS

| | | |
|---|---|---|
| JP | 2004-266316 | 9/2004 |
| KR | 10-2004-0038239 | 5/2004 |
| KR | 10-2006-0097500 | 9/2006 |

* cited by examiner

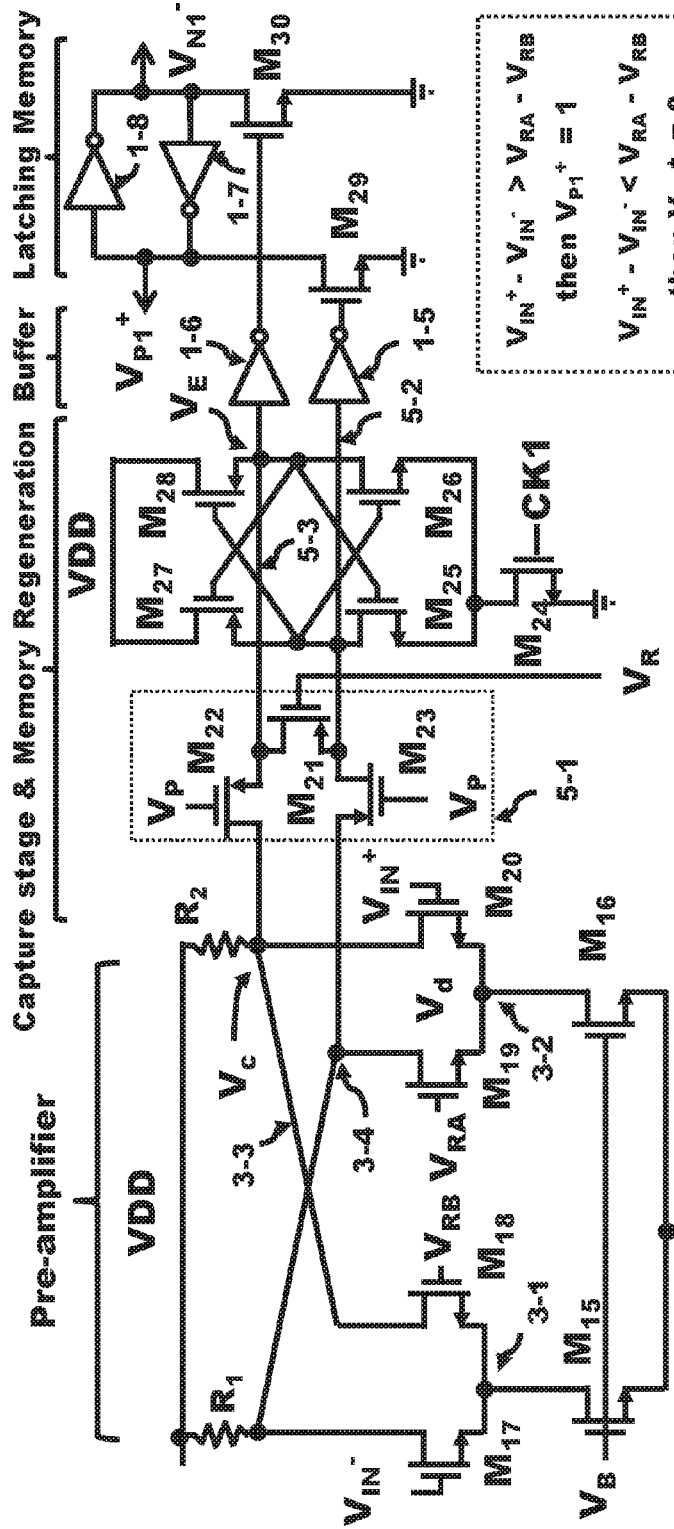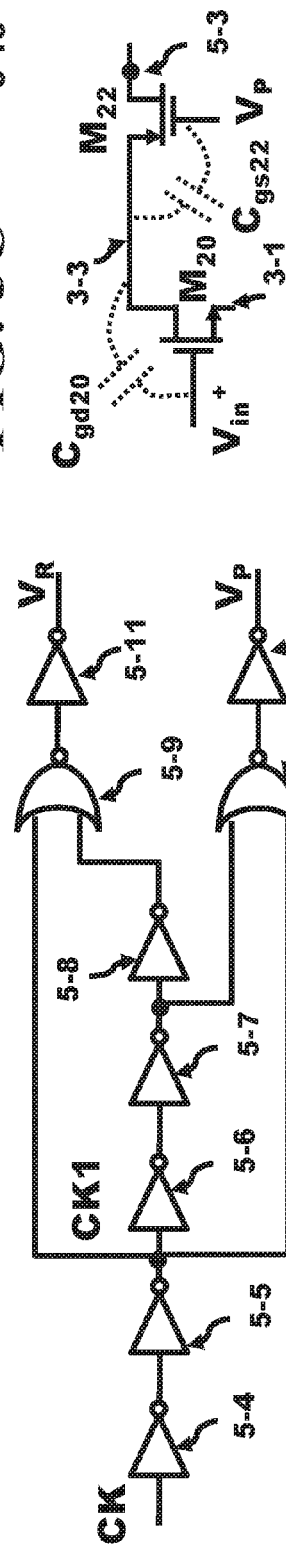
FIG. 5A
FIG. 5B
FIG. 5C
FIG. 5D

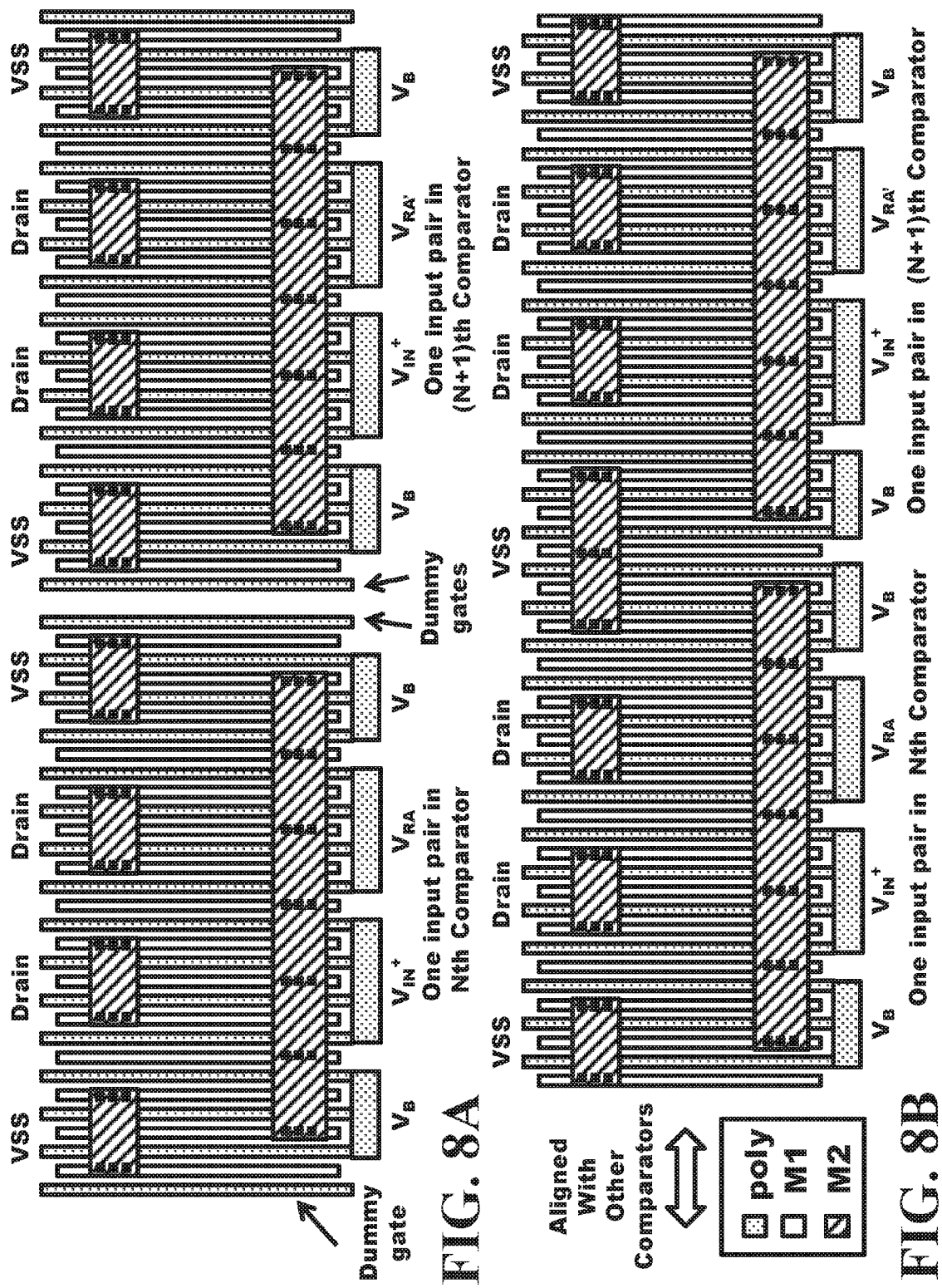

METHOD AND APPARATUS FOR AN ACTIVE NEGATIVE-CAPACITOR CIRCUIT TO CANCEL THE INPUT CAPACITANCE OF COMPARATORS

CROSS-REFERENCE TO RELATED APPLICATIONS

This application is a Continuation of Ser. No. 14/995,471, filed on Jan. 14, 2016, now U.S. Pat. No. 9,484,941, which is a Continuation of Ser. No. 14/672,214, filed on Mar. 29, 2015, now U.S. Pat. No. 9,264,056, which is a Continuation of Ser. No. 13/602,216, filed Sep. 3, 2012, now U.S. Pat. No. 9,124,279, which is related to Ser. No. 13/602,215, filed on Sep. 3, 2012, all of which are expressly incorporated by reference in their entireties.

BACKGROUND

The Federal Communications Commission (FCC) has allotted a spectrum of bandwidth in the 60 GHz frequency range (57 to 64 GHz). The Wireless Gigabit Alliance (Wi-Gig) is targeting the standardization of this frequency band which will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS), Silicon-Germanium (SiGe) or Gallium Arsenide (GaAs) technology to form the dice in these designs. Since WiGig transceivers use Digital to Analog Converters (DAC), the reduced power supply impacts the performance of the DAC's.

Complementary Metal Oxide Semiconductor (CMOS) is the primary technology used to construct integrated circuits. N-channel transistors and P-channel transistors (MOS transistor) are used in this technology which uses fine line technology to consistently reduce the channel length of the MOS transistors. Some of the current values for this technology include the channel length being 40 nm, the power supply of VDD equaling 1.2V and the number of layers of metal levels being 8 or more. This technology typically scales with technology.

CMOS technology delivers a designer the ability to form a very large system level design on one die which is known as a System On a Chip (SOC). The SOC is a complex system with millions, if not billions, of transistors which contain analog circuits and digital circuits. The analog circuits operate purely analog, the digital circuits operate purely digital and these two circuits types can be combined together to form circuits operating in a mixed-signal mode.

For example, digital circuits in their basic form only use digital logic and some examples can be a component comprising at least one; processor, memory, control logic, digital I/O circuit, reconfigurable logic and/or hardware programmed that to operate as hardware emulator. Analog circuits in their basic form use only analog circuits and some examples can be a component comprising at least one; amplifier, oscillator, mixer, and/or filter. Mixed signal in their basic form only use both digital and analog circuits and some examples can be a component comprising at least one: Digital to Analog Converter (DAC), Analog to Digital Converter (ADC), Programmable Gain Amplifier (PGA), Power Supply control, Phase Lock Loop (PLL), and/or transistor behavior control over Process, Voltage and Temperature (PVT). The combination of digital logic components with analog circuit components can appear to behave like mixed signal circuits; furthermore, the examples that have been provided are not exhaustive as one knowledgeable in the arts understands.

One of the critical design parameters of a transceiver occurs when a continuous analog signal is converted into a digital time signal in the ADC. A flash ADC uses a linear reference voltage source that is tapped and applied to one of the differential inputs of a number of parallel comparators. The input analog value is applied to the other differential input of all the comparators simultaneously providing a very quick comparison. Several critical issues can occur in this conversion which includes: 1) the matching of the input transistors within and between the comparators; 2) clock kick-back from the clock enabling the comparators to the input signal; and 3) a reduction in bandwidth between the PGA and the large capacitive load of the ADC and the interconnect.

The matching of transistors within and between the comparators uses dummy transistors which use up valuable semiconductor area and causes an increase in the power dissipation due to increased wire lengths of the data and clock lines. If the matching of the transistors is not maintained well, the issue becomes a mismatching condition. The bandwidth of the ADC is limited by the input signal driving the input capacitive load of all the parallel comparators and the interconnect. This necessitates that the transistor width of the input transistors of the comparators to have an upper bound. Such a transistor width may not be sufficient and cause the matching problem to become more severe. Increasing the width of the transistor beyond this upper bound helps overcome the mismatching condition but causes the bandwidth of the ADC to reduce. Other solutions are required to resolve the mismatching condition yet allow the desired bandwidth to be satisfied simultaneously.

Clock kick-back from the clock to the input signal of a gate usually occurs via the capacitance coupling between the terminals of the active transistor, i.e., the gate overlap capacitance from the source and drain terminals to the gate terminal of an MOS transistor. As the width of the transistor is increased, the coupling capacitance increases which increases the clock kick-back. In addition, the power dissipation of the system increases as well because of the increased width of the transistors. A second aspect of clock kick-back is the transient behavior of the circuit being clocked between an initialization state and a steady state. The internal nodes of the clocked circuit during the transient period also generate a clock kick-back besides increasing the delay of the operation of the circuit. Several solutions are provided which overcome these shortcomings by reducing clock kick-back, thereby improving the performance of the circuit.

The signal delivery between the PGA and the ADC can be delayed by the large gate capacitance of the MOS transistors and the interconnect capacitance of the metal trace used to couple these comparators. The transfer of signals between the PGA and the ADC causes a decrease in the bandwidth of the path due to the capacitance. Typically, the performance of the ADC can be improved by increasing the width of the transistors to achieve a faster response. But the larger transistors, besides increasing the kick-back and power dissipation, also increase the delay of the signal delivery because of the larger gate capacitance being presented to the output of the PGA. The transfer of data on the interconnect between the PGA and ADC is critical to improving the performance of the system. A new technique will be presented to improve the signal's transfer at this critical node and improve the bandwidth of the captured signal.

SUMMARY

As the power supply voltage continues to reduce in the scaling of integrated circuits, the voltage headroom for analog integrated circuits decreases correspondingly. This makes the design of high performance circuits such as ADC systems in an integrated circuit much more challenging. Thus, the proper layout of comparators in an integrated circuit implementing an ADC is of great importance to overcome the mismatching condition. The comparators require that critical transistors, such as the input transistors, are matched to one another in terms of their local environment. The layout features of adjacent circuits can impact the behavior of a transistor in the current circuit by forming mismatches due to the various processing steps used to manufacture the integrated circuit. Increasing the length of the input transistors of the comparators helps to overcome this mismatch condition, but the input capacitance of the comparators increases and the performance decreases causing the bandwidth of the ADC to be reduced.

Mismatches between transistors, especially input transistor pairs, will lead to false comparator outputs. In addition, improper layout may lead to significant mismatches both within one comparator and between identical comparators during manufacture. Both mismatches may result in the ADC making false decisions. Furthermore, a poorly packed layout design will add unnecessary interconnect trace lengths for both signal and clock, especially for an ADC with large number of comparators. These longer trace interconnects, implemented as a differential signal that has parallel routings, will dramatically degrade the bandwidth of the system. The longer clock routing requires larger clock buffers which increase the overall power consumption, and more profoundly, additional clock jitter will occur, which will cause problems such as bubbles in the decoded results and lower ENOB (Effective Number of Bits). The longer power supply lines introduce additional IR drops, which further contribute to the mismatches among different comparators.

A simple layout technique is proposed in this embodiment that minimizes the concerns of the above aspects. Instead of having extra dummy fingers for each comparator to reduce the mismatch within one comparator between input transistors, the comparators are aligned right next to each other, so that all the input transistors share one whole active area. Thereby, the fingers on the edge of the active area serve as the dummy fingers for the neighboring comparators.

In another embodiment, the core concept of this ADC is the high-speed fully-differential comparators which are clocked at 2640 MHz that is used in the 60 GHz transceiver. Basically, each comparator consists of four parts: a pre-amplifier stage which samples and amplifies the input signal from the preceding stage or Programmable Gain Amplifier (PGA); a capture stage that is clocked to capture the contents of the pre-amplifier stage; a pair of clocked cross-coupled transistors which regenerates the small signal to nearly a rail-to-rail signal; and an output latch which latches up the previous results after regeneration for application to the following static CMOS circuits. The pre-amplifier stage is not clocked; therefore, the pre-amplifier stage does not suffer initialization and transient behavior effects. Instead, a capture stage uses the clock signal to transfer the contents of the pre-amplifier stage into a memory regeneration stage. The capture stage is clocked by pulses that are timed to minimize the clock kick-back generated by the memory regeneration stage.

In another embodiment, since a flash ADC converter is used, a number of comparators are placed in parallel with their inputs connected together. The clock kick-back from the many pre-amplifier stages to the PGA is significantly reduced by incorporating the use of a clock-less pre-amplifier stage. Since the clocking occurs after the pre-amplifier stage in the capture and memory regeneration stages, the capture stage isolates the clock kick-back from proceeding into the pre-amplifier stage. In addition, because the pre-amplifier stages are not clocked, their transient response of being enabled and disabled is eliminated thereby reducing this portion of the clock kick-back of the pre-amplifier stage. Thus, the clock kick-back is inventively reduced even when 17 comparators are driven simultaneously by one differential signal source by addressing several the above aspects in this design.

The differential output of the PGA is loaded by the input differential gate capacitance of 17 comparators. Differential metal layer traces are used to interconnect these 17 comparators to the PGA. Both the input capacitance of the comparators and the capacitance of the metal layer trace add together to increase the differential capacitive load. The differential capacitive load presented to the PGA is quite large and reduces the bandwidth of this signal path. Thus, this implies that the input differential pair of transistors in the comparator should not be excessively large in width in order to minimize the input capacitance and reduce the corresponding power dissipation. However, the embodiment presented in this inventive idea allows the input gates of the comparator to have large width transistors which overcomes the performance degradation due to capacitance mentioned above in the ADC comparator. The inventive idea uses an active negative-capacitor circuit to cancel the effect of the large input capacitance of the comparators. This cancellation minimizes the capacitance between the PGA and ADC and extends the gain characteristics of the interface between the PGA's output and the inputs of the first stage of the comparators. The active negative-capacitance, basically, is a cross pair NMOS with a capacitor connecting their sources, and each NMOS is biased by a current source.

Various embodiments and aspects of the inventions will be described with reference to details discussed below, and the accompanying drawings will illustrate the various embodiments. The following description is illustrative of the invention and is not to be construed as limiting the invention. Numerous specific details are described to provide a thorough understanding of various embodiments of the present invention. However, in certain instances, well-known or conventional details are not described in order to provide a concise discussion of embodiments of the present inventions.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be thorough and complete, and will fully convey the scope of the invention to those skilled in the art. In other instances, well-known structures and functions have not been shown or described in detail to avoid unnecessarily obscuring the description of the embodiment of the invention. Like numbers refer to like elements in the diagrams.

FIG. 5A illustrates the circuit schematic of the innovative comparator in accordance with the present invention.

FIG. 5B depicts the reset pulse generator used in the circuit schematic of FIG. 5A in accordance with the present invention.

FIG. 5C shows a table illustrating the voltage inputs and outputs of the inventive circuit of FIG. 5A in accordance with the present invention.

FIG. 5D illustrates a portion of the circuit schematic of the innovative comparator of FIG. 5A illustrating the two series coupling capacitance reducing the clock kick-back in accordance with the present invention.

FIG. 8A shows a conventional transistor layout of the current source and one of the input pairs of two comparators.

FIG. 8B presents an inventive transistor layout of the current source and one of the input pairs of two comparators in accordance with the present invention.

DETAILED DESCRIPTION

The inventions presented in this specification can be used in any wired or wireless system or any low power supply voltage design. The techniques are applicable to any amplifier design, ADC design, or PGA and ADC interface design. These techniques can be extended to other circuit designs where an increased bandwidth between two interfaces, a clock kick-back reduction, or a matched transistor within a circuit is required.

Figure 1:
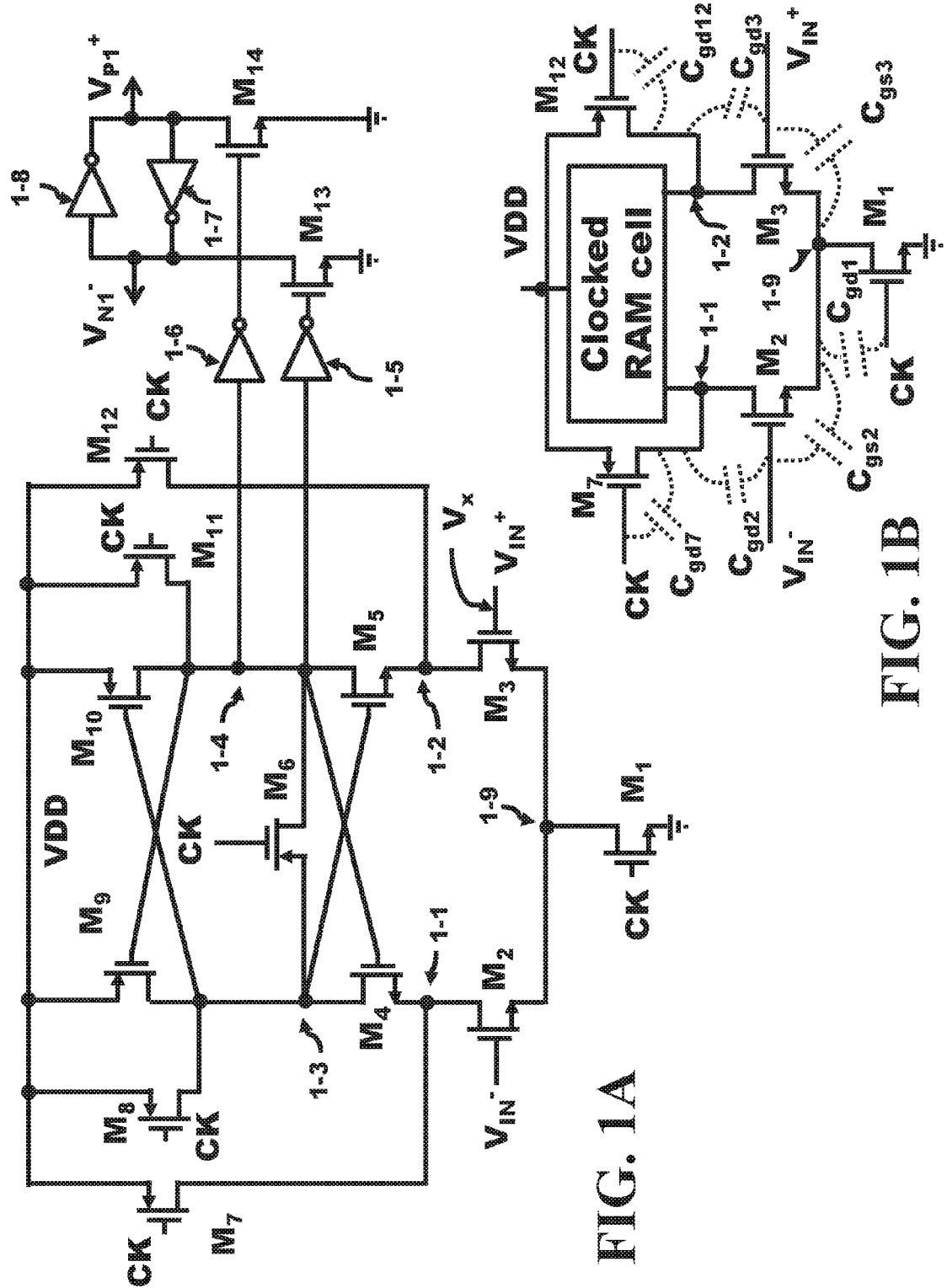
FIG. 1A illustrates the circuit schematic of a conventional comparator.
FIG. 1B presents a portion of the circuit schematic of a conventional comparator and the coupling capacitance between the terminals of the transistors pertaining to clock kick-back.

A comparator that is clocked in the first pre-amplifier stage is illustrated in FIG. 1A. The basic construction of the clocked pre-amplifier stage includes a ground switch $M_1$ with a gate coupled to a clock CK. The drain of $M_1$ 1-9 is coupled to the source of two N-channel transistors $M_2$ and $M_3$. $M_2$ is driven by $V_{IN-}$ while $M_3$ is driven by the other differential input signal $V_{IN+}$. The drain of $M_2$ is coupled to 1-1 and is also coupled to the drain of P-channel transistor $M_7$ controlled by the same clock CK. The drain of transistor $M_3$ 1-2 is coupled to the drain of P-channel transistor $M_{12}$ controlled by the same clock CK. A RAM cell is coupled between the two nodes 1-1 and 1-2 and the supply VDD. The transistors of the RAM cell include $M_4$, $M_5$, $M_9$ and $M_{10}$. Note that $M_4$ is cross coupled to $M_5$ and $M_9$ is cross coupled to $M_{10}$. The drain of N-channel transistor $M_4$ is coupled to the drain of P-channel transistor $M_9$. The drain of N-channel transistor $M_5$ is coupled to the drain of P-channel transistor $M_{10}$. The two outputs of the RAM cell 1-3 and 1-4 are also coupled to transistors $M_8$ and $M_{11}$ and controlled by the same clock signal CK. In addition, the two outputs of the RAM cell are coupled by the P-channel transistor $M_6$ controlled by clock CK to initialize the cell. Thus, this first stage of the pre-amplifier stage uses a single clock to initialize and capture the signal being presented at the two input nodes $V_{IN-}$ and $V_{IN+}$.

Basically, with this topology, when the clock CK flips from low to high, the tail transistor ($M_1$) will drag the sources of the two input transistors to ground rapidly, leading to a large kick back to the input signal through $C_{gs2}$ and $C_{gs3}$ (see FIG. 2b) of the transistors $M_2$ and $M_3$, respectively, and disturbs the operation of other comparators. When the clock flips from high to low, the drain of the two input transistors will be pre-charged to VDD, also causing kick back at the input signal through $C_{gd2}$ and $C_{gd3}$. These kick-backs become more serious when the comparator is operated at higher frequencies (for example, 2.64 GHz).

In the second portion of the circuit, the outputs of the clock comparator 1-3 and 1-4 are applied to the inverters 1-5 and 1-6. These inverters drive the gates of the N-channel transistors $M_{13}$ and $M_{14}$, respectively. These two N-channel transistors rewrite or maintain the contents of the data that is stored in the cross coupled memory cell composed of inverters 1-7 and 1-8. The outputs are drawn from the output of this coupled cross coupled memory cell consisting of the two back to back inverters and these outputs are the $V_{N1-}$ and the $V_{P1+}$.

Looking at the clocked pre-amplifier stage, a P-channel transistor couples the outputs 1-3 and 1-4 together to initialize the cell when CK is low. This transistor is labeled as $M_6$ and is clocked by CK. When CK goes low, the two outputs of the differential comparator equalize simultaneously. When clock CK is low, the N-channel transistor $M_1$ is disabled and all of the remaining P-channel transistors $M_7$, $M_8$, $M_9$, $M_{10}$, $M_{11}$ and $M_{12}$ are all enabled causing the nodes 1-3 and 1-4 to pre-charge to VDD. Once the clock goes high enabling $M_1$, all of the P-channel transistors $M_6$-$M_{12}$ become disabled and the contents of the first RAM memory cell consisting of the cross coupled transistors $M_4$, $M_5$, $M_9$ and $M_{10}$ amplifies the difference of the signals that is applied to the N-channel gates $M_2$ and $M_3$. A transient behavior occurs before the cell can make a decision. This transient behavior occurs because both output nodes were pre-charged to VDD in the initialization state. When the cell becomes enabled, a transient occurs until the circuit reaches a steady-state and finally captures the input signal, at this point, the voltages at nodes 1-1, 1-2, 1-3 and 1-4 are stable. Once this steady state occurs, the first RAM memory cell stabilizes the voltages at its output nodes 1-3 and 1-4 and the captured information is then applied to the second stage portion of the latch. The inputs applied to $M_2$ and $M_3$ are amplified and captured in the RAM cell. As the differential voltage between these inputs decreases, the kick-back generated by this pre-amplifier and the others may produce erroneous results at nodes 1-3 and 1-4 before the pre-amplifier has had a chance to stabilize. The second portion comprises the two inverters 1-5 and 1-6 used to amplify, isolate and provide the signal to a second RAM memory cell consisting of inverters 1-7 and 1-8 enabled by $M_{13}$ and $M_{14}$.

The buffer interface provides coupling of the differential signal from the first RAM cell to the second RAM memory cell. The second RAM memory cell comprises the back to back coupled inverters 1-7 and 1-8. The content of the second RAM memory cell is either over-written with new content or maintains the same content depending on the current values being introduced to the cell and the previous values held by the cell from the last capture. The outputs of the comparator are the voltages $V_{N1-}$ and $V_{P1+}$. The transistors $M_{13}$ and $M_{14}$ of the second RAM memory cell over-write the contents of the cell if the transistor that is enable by one of the inverter's 1-5 or 1-6 output flip the contents of the second RAM cell. Note that during the first RAM cell initialization, nodes 1-3 and 1-4 are high preventing $M_{13}$ and $M_{14}$ from overwriting the second RAM cell. The transistors $M_{13}$ and $M_{14}$ of the second RAM memory cell maintain the contents of the cell if the transistor that is enable by the inverter's output couples the logical zero contents of the second RAM cell to ground. The transistors $M_{13}$ and $M_{14}$ of the second RAM memory cell switch the contents of the cell if the transistor that is enable by the inverter's output couples the logical one contents of the second RAM cell to ground.

The circuit in FIG. 1A suffers several drawbacks; 1) the ground switch transistor $M_1$ is in series between VDD and the memory cell reducing the voltage headroom and decreasing the performance; 2) the transient behavior of the first RAM cell from initialization to steady state introduces large voltage swings at nodes 1-1, 1-2 and 1-9 causing potential capacitance signal feedback between the terminals of the transistors $M_2$ and $M_3$ into the input signal which introduces a kick-back into the input signal thereby causing inaccuracies in the capture of the signal; 3) the clocked transistors $M_1$ and $M_6$-$M_{12}$ introduce a kick-back into the internal nodes of the comparator effecting the accuracy of the capture of the input signal; and 4) the changing clock edge on the gates of $M_1$, $M_7$ and $M_{12}$ introduce a clock kick-back into the input signal and decrease the accuracy of the captured signal. Lastly, the circuit requires a larger clock driver to drive the capacitive load of all the transistors thereby increasing the overall power dissipation of the final circuit.

FIG. 1B illustrates a simplified version of the schematic in FIG. 1A and shows the various capacitors between the terminals of a transistor that influence the internal nodes due to clock kick-back that affects the behavior of the circuit. The clock CK swings nearly the nearly full rail (VDD to VSS) and any capacitance coupled to the clock line transfers some of that clock to the other side of the capacitor. The gate to drain capacitance $C_{gd1}$ in transistor $M_1$ and the gate to source capacitances $C_{gs2}$ and $C_{gs3}$ of transistors $M_2$ and $M_3$, respectively, are illustrated in FIG. 1B. In addition, the gate to drain capacitance $C_{gd2}$ and $C_{gd3}$ of $M_2$ and $M_3$ and the gate to drain transistor capacitance $C_{gd7}$ and $C_{gd12}$ of $M_7$ and $M_{12}$, respectively, are also depicted. These coupling capacitors help illustrate how the clock kick-back functions. When the differential comparator is enabled, the clock signal CK transitions from a zero to a one and injects a charge at node 1-9 via $C_{gd1}$. The injected charge at 1-9 is also coupled to the input nodes $V_{IN-}$ and the $V_{IN+}$ via $C_{gs2}$ and $C_{gs3}$, respectively. Fortunately, these two capacitors are in series somewhat diminishing the clock kick-back. However the clock that is applied to P-channel transistors $M_7$ and $M_{12}$ is also fed through the gate to drain node to nodes 1-1 and 1-2, respectively. The voltage at these two points is also coupled to the input via gate to drain capacitance of the transistors $M_2$ and $M_3$ or $C_{gd2}$ and $C_{gd3}$. So thus, as the clock varies from one polarity to another, the injected charge of the clock signal is fed back to the input node and is a first portion of the clock kick-back.

A second portion of the clock kick-back is the transient behavior of the pre-amplifier stage from initialization to steady state which introduces large transient voltage swings at nodes 1-1, 1-2 and 1-9. The transient voltage signal swing at node 1-1 is coupled to the input node $V_{IN-}$ by a capacitor $C_{gd2}$, the transient voltage signal swing at node 1-2 is coupled to the input node $V_{IN+}$ by a capacitor $C_{gd3}$ and the transient voltage signal swing at node 1-9 is coupled to the input node $V_{IN+}$ and $V_{IN-}$ by the capacitor $C_{gs3}$ and $C_{gs2}$, respectively. These feedback capacitance signals between the terminal of the transistors $M_2$ and $M_3$ into the input nodes accounts for a second portion of the of the clock kick-back and introduces inaccuracies in the capture of the signal.

Figure 2:
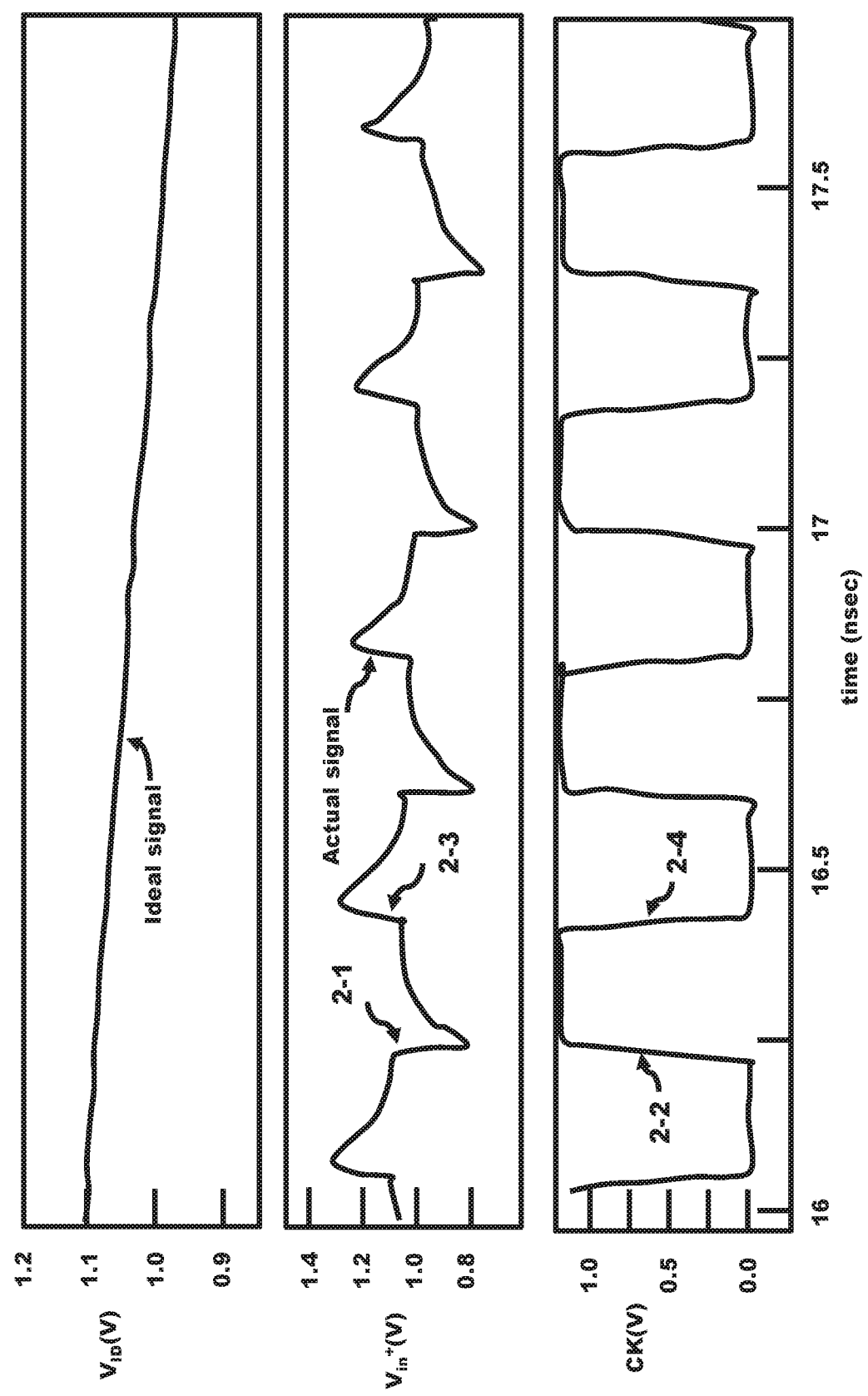
FIG. 2 depicts the timing diagrams of a conventional comparator.

The advice results due to the clock kick-back of certain nodes for the comparator depicted in FIG. 1A are illustrated in the FIG. 2. The top waveform $V_{ID}$ is an ideal plot of the input signal. The ideal signal illustrates what the input signal $V_{IN+}$ would appear without a clock kick-back. The middle and bottom waveforms $V_{IN+}$ and CK are the simulated results of the input signal $V_{IN+}$ and CK. This CK waveform presents an edge 2-2 going high which enables the clocked comparator and due to the effects that were mentioned earlier, the ideal input signal experiences of glitch at 2-1 as shown in the actual input signal $V_{IN+}$. Similarly, when the CK waveform goes low 2-4, the actual input signal $V_{IN+}$ experiences a positive glitch 2-3 due to the effects that were mentioned earlier. These glitches occur each time the clock makes a transition because of the coupling capacitance due to the capacitances between the terminals of the transistor and the transient behavior of the comparator being enabled and disabled. The $V_{IN+}$ signal follows the ideal input signal $V_{IN+}$ with the addition noise or glitches due to the clock kick-back. The extraction of the data from the input signal $V_{IN+}$ becomes more difficult due to these glitches and increases the inaccuracy of the translation of the analog to digital conversion. Thus, a source of error of determining the voltage values of the input signal basically occurs due to the clock kick-back. The kick-back is approximately 200 mV in the positive and the negative directions which causes errors to occur when one wants to capture the ideal input signal. If the kickback clock effect can be decreased or reduced then the accuracy of the translation of the signal would improve.

To minimize the above issues, two major embodiments are introduced. The first is to remove the clock transistors in the pre-amplifier stage, so that the pre-amplifier will keep amplifying the signal without being disturbed by a clock kick-back signal and not suffer the large transient behavior of being enabled and disabled. The second is to use a reset pulse generator circuit to create a "reset" signal applied to a reset transistor in the capture stage to initialize the regeneration stage. The generator also creates a "pass" signal applied to pass transistors in the capture stage that allows the signal from the pre-amplifier to pass to the regeneration stage with proper timing. The "reset" signal and "pass" signal are adjusted to minimize the kick-back.

Figure 3A:
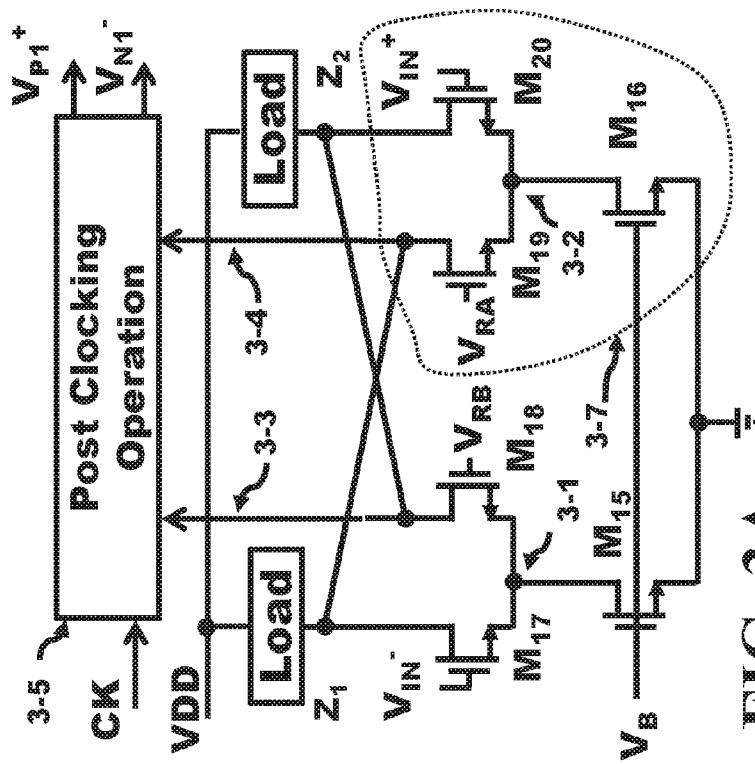
FIG. 3A shows the circuit schematic of the comparator and post operating block in accordance with the present invention.

A differential comparator which eliminates the clocking in the pre-amplifier stage of the comparator is illustrated in FIG. 3A. The second stage latching with a clock CK occurs in the Post Clocking Operation block 3-5. Depending on when the second latch is opened in capturing the data will make an influence on how accurate the capture signal corresponds to the actual or ideal signal. The circuit configuration of the pre-amplifier stage of the clock-less comparator using transistors and loads is illustrated. The output of this circuit couples to the Post Clocking Operation block 3-5 via lines 3-3 and 3-4. A biasing voltage $V_B$ is applied to transistors $M_{15}$ and $M_{16}$ which mirror a current source. The drain of transistors $M_{15}$ 3-1 and M16 3-2 are each connected to a differential transistor circuit. The first differential transistor circuit connected to 3-1 consists of N-channels $M_{17}$ and $M_{18}$ coupled through loads to VDD. The loads can be comprised of resistors and/or reactive components. This first differential transistor circuit has the input signals $V_{IN-}$ and $V_{BB}$ applied to the gates of $M_{17}$ and $M_{18}$, respectively. The second differential transistor circuit connected to 3-2 is also coupled through the same loads to VDD. The second differential transistor circuit consists of the N-channels $M_{19}$ and $M_{20}$ connected to node 3-2. This second differential transistor circuit has the input signals $V_{RA}$ and $V_{IN+}$ applied to the gates of $M_{19}$ and $M_{20}$, respectively. The voltages $V_{RA}$ and $V_{BB}$ are input reference signals and are derived from a resistor chain (to be described shortly). The right leg of both differential pairs sinks current from load $Z_2$ while the left leg of the differential pair sinks current from load $Z_1$ where both of the loads $Z_1$ and $Z_2$ are coupled to VDD. The transistor structure of $M_{16}$, $M_{19}$ and $M_{20}$ is called a differential stage 3-7. This differential stage 3-7 has a current mirror, $M_{16}$, a first input transistor, $M_{19}$, and a second input transistor, $M_{20}$. The outputs of the differential stage are coupled to nodes 3-3 and 3-4. The transistors $M_{15}$, $M_{17}$ and $M_{18}$ make a second differential stage. The first output 3-3 of the pre-amplifier stage is extracted at the drains of transistor $M_{18}$ and transistor $M_{20}$ and the second output 3-4 of the pre-amplifier stage is tapped at the drains of transistor $M_{19}$ and transistor $M_{17}$. These two outputs are differential outputs. Note that this pre-amplifier stage is not clocked at all, in other words, it is clock-less. This should reduce the clock kick-back and improve the capture of the input signal.

Figure 3B:
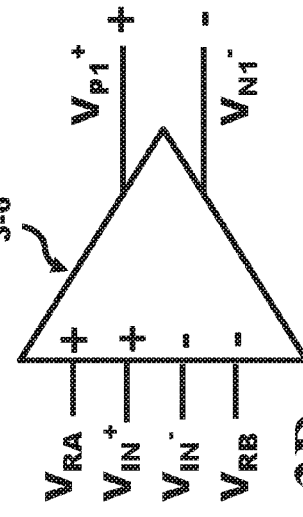
FIG. 3B illustrates the symbol of FIG. 3A in accordance with the present invention.

All of the clocking for this innovative comparator is applied to the Post Clocking Operation block 3-5 to generate the outputs $V_{P1+}$ and $V_{N1-}$. The post clocking operation segregates the clocking from the pre-amplifier stage of the differential comparator and minimizes the clock kick-back. The symbol of the differential comparator is illustrated in FIG. 3B. It has four input signals and two output signals. The biasing voltage and power supply voltages are not illustrated in this symbol; however, the two input signals $V_{IN+}$ and $V_{IN-}$ are shown on the inside of the four of the inputs on the left and the outer inputs are the two input reference voltages $V_{RA}$ and $V_{RB}$, the outputs of the differential comparator 3-6 is provided at the nodes $V_{P1+}$ an $V_{N1-}$.

Figure 4:
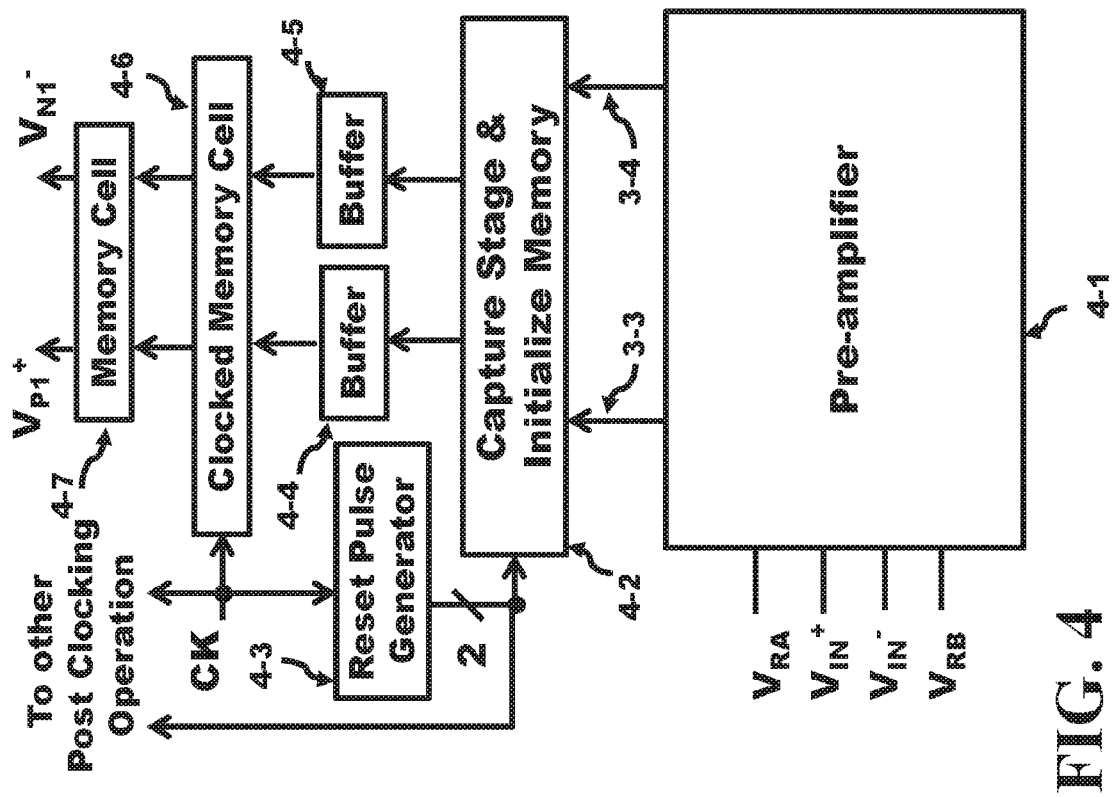
FIG. 4 presents block diagram of the comparator in accordance with the present invention.

FIG. 4 illustrates a block representation of the differential comparator 3-6 illustrated in FIG. 3B and FIG. 3A. The pre-amplifier stage 4-1 is driven by the four input signals which are the two reference signals $V_{RA}$ and $V_{RB}$ as well as the input signals $V_{IN+}$ and $V_{IN-}$. The output of the pre-amplifier stage 4-1 corresponds to the two previous outputs 3-3 and 3-4 illustrated in FIG. 3A. The remaining blocks are the blocks that are within the Post Clocking Operation block 3-5 shown in FIG. 3A. The clock is applied in the upper left to the Reset Pulse Generator 4-3 and generates two outputs that are applied to the reset and pass transistors of the Capture stage and Initialize Memory block 4-2. This block captures the outputs of the pre-amplifier stage on lines 3-3 and 3-4 and applies the captured signals to buffers 4-4 and 4-5. The clock is also applied to Clocked Memory Cell block 4-6 which captures the outputs of the two buffer circuits. The Clocked Memory Cell block 4-6 is then applied to the Memory Cell block 4-7 to generate two outputs $V_{P1+}$ and $V_{N1-}$. The clock signal is also applied to the Post Clocking Operation block of other comparators.

A more detailed analysis of FIG. 4 is illustrated in FIG. 5A. The pre-amplifier stage, the capture stage and memory regeneration, the two buffers, and the latching memory stage are identified along the top of the FIG. 5A. The loads $Z_1$ and $Z_2$ are replaced with resistors $R_1$ and $R_2$, respectively. The reset pulse generator 4-3 of FIG. 4 is shown schematically in FIG. 5B. This circuit generates the timing of the waveforms for the capture stage 5-1. The clock signal enables the reset pulse generator to generate pulses. The clock is applied to the first inverter 5-4 which is buffered by 5-5. The output of 5-5 is CK1 and is also applied to other portions of the capture stage and memory circuit. The clock CK1 is applied to inverter 5-6 which is coupled to inverter 5-7. The signals CK1 and the output of inverter 5-7 are applied to the NOR gate 5-10 which is buffered by the inverter 5-12 to generate the pass pulse $V_P$. Simultaneously, the clock CK1 and the output of inverter 5-8 driven by inverter 5-7 are applied to a second NOR gate 5-9 that is buffered by 5-11 to generate the reset pulse, $V_R$. These two signals, the pass and reset pulses are applied to the reset and pass transistors of the capture stage 5-1 which consists of transistors $M_{21}$, $M_{22}$ and $M_{23}$. The reset pulse, $V_R$, is applied to reset transistor $M_{21}$ to reset the memory cell consisting of transistors $M_{24}$-$M_{28}$. The two pass transistors $M_{22}$ and $M_{23}$ are clocked by the pass pulse, $V_P$, and transfer the contents of the pre-amplifier stage and pass them into the first clocked memory cell. Note that $V_P$ and $V_R$ are both low-effective since $M_{21}$, $M_{22}$ and $M_{23}$ are P-channels.

The memory regeneration stage consists of a common clocked transistor $M_{24}$ coupled to a first inverter $M_{27}$ and $M_{25}$ and a second inverter $M_{28}$ and $M_{26}$. The output of the first inverter is coupled to the input of the second inverter. Similarly, the output of the second inverter is coupled to the input of the first inverter forming a back-to-back coupled RAM cell that is clocked by CK1 via the transistor $M_{24}$. The two outputs of the RAM cell 5-2 and 5-3 are buffered by the buffers 1-5 and 1-6, respectively. The inverter's output is then applied to a latching memory stage consisting of the back-to-back inverters 1-7 and 1-8. Each output of the latching memory stage has an N-channel transistor $M_{29}$ and $M_{30}$ coupled to ground. Depending on the values of the differential signal provided by the inverters 1-5 and 1-6, the contents of the latching memory stage can be switched or maintain at the same values as before. The outputs of the latching memory cell are $V_{P1+}$ and $V_{N1-}$.

At beginning of each clock cycle (starting from the falling edge), as clock goes low, the memory regeneration stage is disabled. After a fixed delay, a reset pulse is generated, initializing both outputs of the memory regeneration stage. The nodes 5-2 and 5-3 are equalized and are above the threshold voltage of the inverters 1-5 and 1-6 preventing the last RAM cell, 1-7 and 1-8, from being overwritten. This step effectively reduces the chance of error caused by the kick-back. After the reset pulse is disabled, the pass pulse is generated, shorting the pre-amplifier output and memory regeneration stage. Depending on the pulse width of this pass pulse, a slight kick-back can still be observed at pre-amplifier output. Nevertheless, since the memory regeneration stage output has been initialized, the kick back will not cause the memory regeneration stage output to flip to the wrong polarity. In practice, however, multiple kick-backs from different comparators may feed through to the input node of the pre-amplifier stage and impair its correctness.

The dotted box 5-13 of FIG. 5C illustrates two conditions for the comparator given in FIG. 5A. The first condition listed is $V_{IN+}$-$V_{IN-}$ is greater than the difference of reference voltage $V_{RA}$-$V_{RB}$, then the output of the circuit $V_{P1+}$ would be a logical one. The second condition listed is $V_{IN+}$-$V_{IN-}$ is less than $V_{RA}$-$V_{RB}$, then the output of the circuit $V_{P1+}$ would be a logical zero.

The coupling capacitances between the terminals of the transistors in a portion of the circuit FIG. 5A are illustrated in FIG. 5D. The $V_P$ pulse is generated by the clock signal CK1 and this signal swings rail to rail and can cause clock kick-back through transistor $M_{22}$ via gate to source capacitance $C_{gs22}$ and the drain to gate capacitance of $M_{20}$. $C_{gd20}$ transfers the signal on 3-3 and passes it to the input signal $V_{IN+}$. Note that there are two series capacitors so that the signal of the clock $V_P$ is diminished before it is sensed at the $V_{IN+}$ terminal. To achieve a comparable performance as when the clock and channel transistor were located at the base of the clock comparator as in FIG. 1A, the transistor widths in FIG. 5A can be reduced for the circuit illustrated. This reduction in width minimizes the overlap capacitance between the terminals of the transistors which is another reason for decreasing any type of clock kick-back that would be sensed at the input voltages of $V_{IN+}$. Furthermore, the pre-amplifier stage is in the steady state condition eliminating a portion of the clock kick-back since this circuit did not need to be initialized. The simulation plots of the circuit illustrated in FIG. 5A are presented in FIG. 6A and FIG. 6B.

Figure 6A:
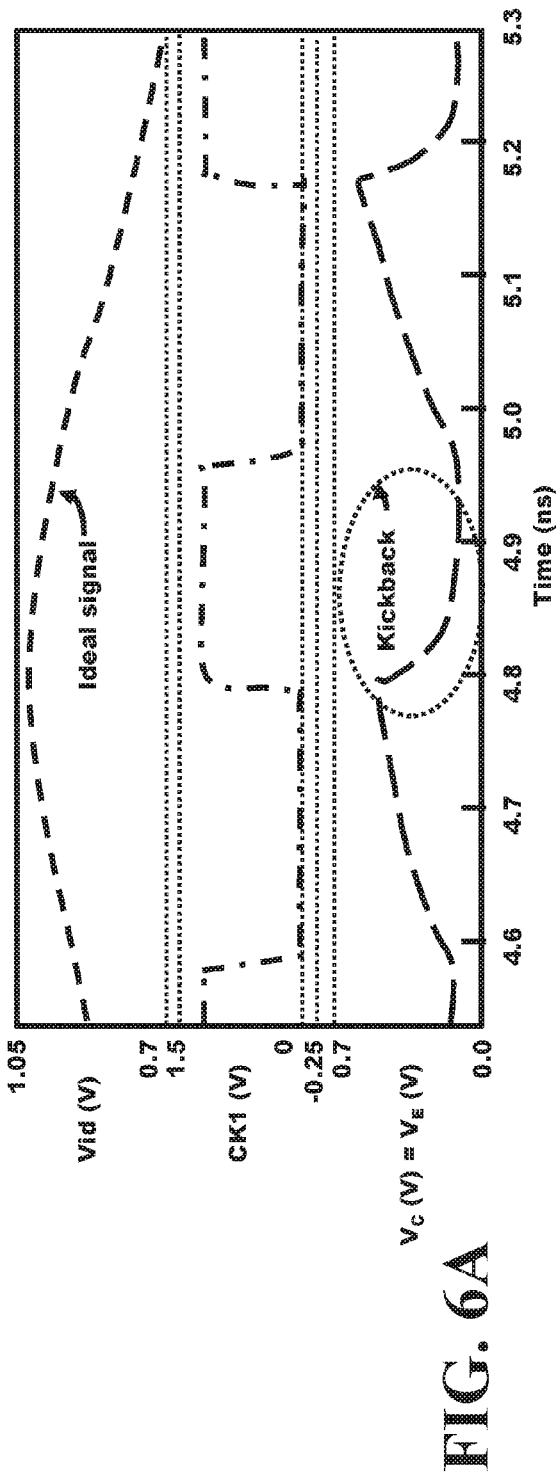
FIG. 6A presents a simulation of the timing for a comparator circuit in absence of transistors $M_{21}$, $M_{22}$, M23 and pulse generator in accordance with the present invention.
Figure 6B:
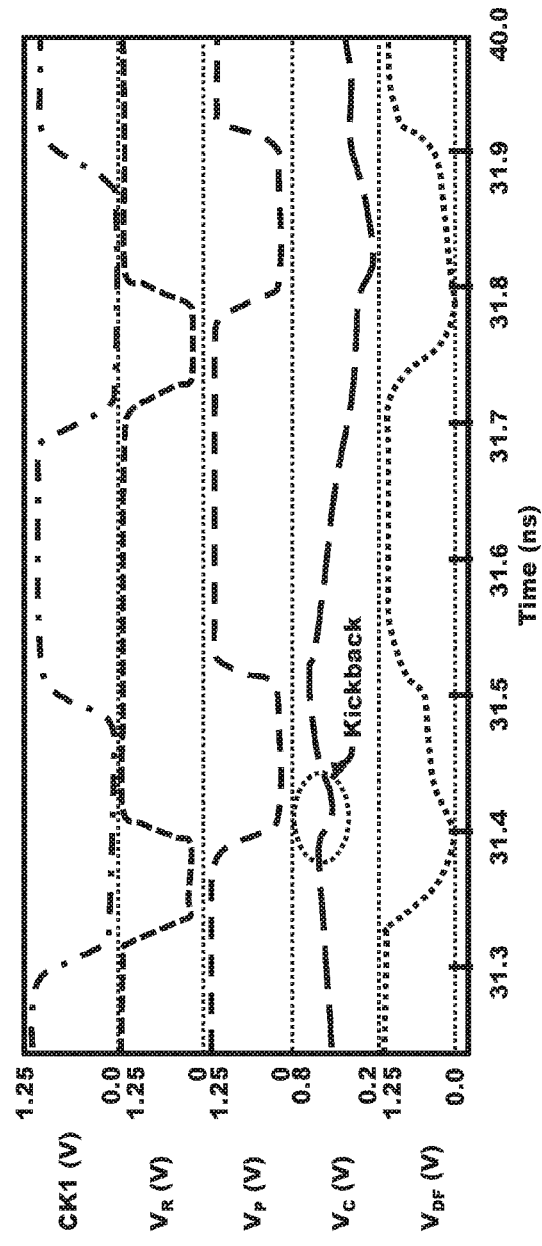
FIG. 6B illustrates a simulation of the timing for a comparator circuit of FIG. 5A in accordance with the present invention.

The minimization of the clock kick-back is illustrated between FIG. 6A and FIG. 6B. In FIG. 6A, three waveforms are shown; the top is the ideal signal $V_{ID}$ the middle signal is CK1 and the bottom signal is $V_C$=$V_E$ because the capture stage 5-1 in FIG. 5A has been replaced by a short. Note that $V_C$ experiences a clock kick-back of over 700 millivolts due to the clock CK1 making a transition. This clock kick-back of the internal node could introduce a significant voltage variation on the input node $V_{IN+}$ which would affect the ideal signal being applied.

To reduce the kick-back, two major modifications are introduced: 1) The clocked transistors in the pre-amplifier stage are removed, so that the pre-amplifier stage will keep amplifying the signal without being disturbed by clock kick-back; and 2) A reset pulse generation circuit (shown in FIG. 5B) is created to generate carefully positioned reset and pass pulses to control the innovative comparator.

In FIG. 6B, the capture stage 5-1 replaces the short mentioned for the simulation results of FIG. 6A and the top waveform is CK1. The next two waveforms correspond to the waveforms of the reset pulse $V_R$ and the pass voltage pulse $V_P$, respectively. The reset pulse generation circuit generates the "reset" pulse for the reset transistor of the capture stage and the "pass" pulse for the pass transistors of the capture stage. The reset pulse initializes the regeneration stage while the pass pulse transfers the signal from the pre-amplifier stage to the regeneration stage with proper timing via the pass transistors in the capture stage. The next waveform is the $V_C$ signal which experiences a very small kickback of 100 millivolts or so while the bottom waveform is a difference waveform $V_{DF}$. The difference waveform $V_{DF}$ shows the difference between the waveform $V_E$ and the waveform on node 5-2. The $V_C$, $V_E$ and 5-2 nodes are labeled in FIG. 5A. The lowest waveform is applied to the inverter 1-6 that passes the signal to the latching memory stage which generates a rail-to-rail voltage. This waveform is applied to the latching memory stage to generate the final output of the comparator.

Note that the kick-back in FIG. 6B has been significantly decreased when compared to the results of FIG. 6A. The rising edge of $V_R$ is adjusted in comparison to the falling edge of $V_P$ within a given time window to minimize the kick-back. This can be achieved by appropriately sizing the inverters/gates of the reset pulse generation circuit in FIG. 5B. This timing adjustment ensures a certain amount of hold time has been satisfied for the first clocked memory cell consisting of transistors $M_{24}$ through $M_{28}$. Such an implementation leads to the control signal waveforms ($V_P$ and $V_R$) shown in FIG. 6B. It can be seen that the memory regeneration stage is enabled (CK1 goes high) before the pass pulse is disabled ($V_P$ goes high). This is based on the observation that the slow memory regeneration stage will not change the pre-amplifier output significantly. Since the pre-amplifier will have another half clock cycle to sample the input signal, this overlap is not likely to cause error for the next sample. Also, FIG. 6A illustrates that without isolation/reset pulse, the pre-amplifier stage output ($V_C$=$V_E$) would be totally distorted by the generated kick-back.

Figure 7:
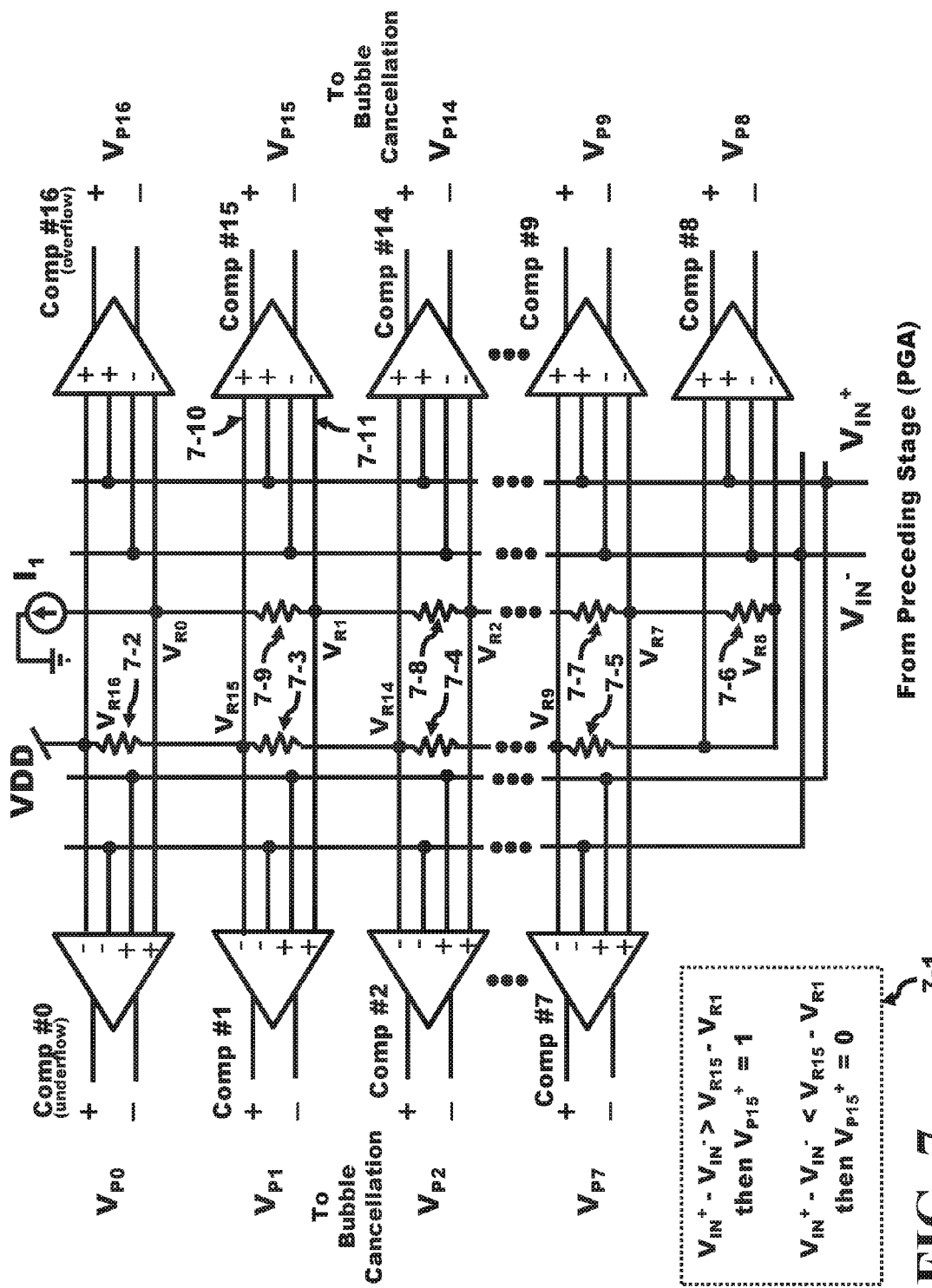
FIG. 7 depicts a diagram of the resistor ladder and comparators in accordance with the present invention.

The 4-bit flash ADC in FIG. 7 consists of 17 comparators, 15 of which divide a reference voltage into 16 sections, while the other two indicate overflow/underflow. To generate 4-bit binary code, the analog input is divided into $2^4$=16 levels, which requires only 15 comparators (comparator #2~#16), so the outputs of comparator #1 and #17 are just overflow/underflow indicators. The thermometer code generated by the comparator array passes through a bubble cancellation circuit and is then translated into binary code, which is de-serialized by the following stage from 2640 MSa/s to 220 MSa/s (Mega Samples per sec).

The core concept of this ADC is the high-speed fully-differential comparators which are clocked at 2640 MHz. Basically, each comparator consists of four parts: a pre-amplifier stage which samples and amplifies the input signal from preceding stage (PGA); a capture stage; a regeneration stage with cross-coupled pairs that is clocked to regenerate the small signal and amplifies the signal to the next stage; and a latching stage which latches up the comparison results after being regenerated providing the signal to the following digital CMOS circuitry.

To work at a 2640 MHz clock rate, the comparators must provide high dc gain to regenerate the signal within the allowed time period yet minimize metastability issues. Fast regeneration, on the other hand, leads to strong kick-back noise at the input node of the pre-amplifier, and due to the Miller feedback effect the noise potentially results in false decisions when the input signal applied to the pre-amplifier stage is small. In addition, large input transistors are also susceptible to clock kick-back when the pre-amplifier stage is clocked as in usual implementations.

A comparator with large width transistors can operate quickly but since the PGA can be loaded with 17 comparators directly, the input capacitance of the comparators can be quite large thereby slowing down the output of the PGA. In addition, the power constraint would be exceeded if large width transistors were used in the pre-amplifier stage.

The innovative comparator circuit illustrated in FIG. 5A with reduced clock kick-back is utilized 17 times in the ADC which is illustrated in FIG. 7. This ADC is a flash converter because all 17 comparators operate simultaneously to calculate the translation. Since all comparators operate simultaneously, the clock kick-back into the input signals $V_{IN+}$ and $V_{IN-}$ is increased 17 times that of a single comparator. This potentially introduces a multiplicative effect at the input signals demonstrating the importance of reducing the clock kick-back to the lowest possible level in the comparator since this comparator is used multiple times.

Instead of having a resistor ladder which generates 33 reference voltages, a resistor ladder having 16 resistor segments is used, and the connections between the resistor segments to the input of the comparators are unconventional. Basically, the implementation is symmetrical with respect to $V_{R8}$. $V_{IN+}$ can be either higher or lower than $V_{IN-}$, and the point where $V_{IN+}=V_{IN}$ is set at the boundary of output $V_{P8}$.

The two inner input signals $V_{IN+}$ and $V_{IN-}$ of the comparator in FIG. 7 are connected to the outputs of the programmable gain amplifier from the proceeding circuit. The outer input reference signals are tapped into the resistor chain formed of 16 resistors 7-2 through 7-9. Note the . . . on all of these lines indicating that there are more resistors and comparators within that region. The resistor chain is positioned between VDD and a current source $I_1$ which is connected to VSS. This resistor string provides a segmented voltage division between VDD and $V_{th}+\Delta$ which can be adjusted by the current $I_1$.

The clock generation circuit works identically in each comparator. The local clock generation circuits avoid extra clock jitter from being generated. Decreasing the jitter improves the performance of the ADC.

As described earlier, there are 17 comparators and the first and last comparators coupled to the resistor string are used for underflow and overflow evaluation. The negative outer input of the underflow comparator (Comp #0) is connected to VDD while the positive outer input is connected to $V_{th}+\Delta$. Thus, the resistor chain provides two input reference signals or voltages to each comparator. The negative outer input of the overflow comparator (Comp #16) is connected to $V_{th}+\Delta$ while the positive outer input is connected to VDD. When the input signals, $V_{IN+}$ and $V_{IN-}$, remain within the range between $V_{th}+\Delta$ and VDD, comp #0 is at a logical high (1) and comp #16 is at a logical low (0) indicating no underflow or no overflow, respectively. However, when the difference between input signals, $V_{IN-}$ and $V_{IN+}$, is greater than the bound of (VDD-$V_{th}$-$\Delta$), comp #16 is set to a logical high (1) which indicates an overflow. And, when the difference between input signals, $V_{IN+}$ and $V_{IN-}$, is less than the bound of -(VDD+$V_{th}$+$\Delta$), comp #0 is set to a logical zero (0) which indicates an underflow.

The remaining comparators (#1-#15) are used to digitize the analog signal which remains within the bounds of $V_{th}+\Delta$ and VDD. For example, comparator #1's outer negative terminal is connected to the top of resistor 7-3 which is the voltage $V_{R15}$ and its outer positive terminal is connected to $V_{R0}$ at the lower end of resistor 7-9 in the resistor string. This comparator generates $V_{P1}$. Similarly, comparator #15 which generates $V_{P15}$ has its outer positive terminal connected to VDD at the top of $V_{R16}$ and its outer negative terminal connected to the bottom of $V_{R0}$ in the resistor string. The outputs of these comparators starting from Comp #15 to Comp #1 would then generate a 1 followed by a number of zeros and the division between one and zero is dependent on the input voltage of $V_{IN+}$ and $V_{IN-}$. For example, in dotted box 7-1 if $V_{IN+}$-$V_{IN-}$ is greater than $V_{R15}$-$V_{R1}$ then the output of comparator #15 $V_{P15+}$ is equal to a digital one. On the other hand, if $V_{IN+}$-$V_{IN-}$ is less than $V_{R15}$-$V_{R1}$ then the output at comparator #15 $V_{P15+}$ is equal to a digital zero. As the input voltage increases, more ones are added to the digital string. The bubble cancellation translates the string into a 4-bit digital binary signal.

As the clock signal propagates through all comparators, "bubbles" may appear at the output thermometer code due to different clock delays. A basic bubble cancellation circuit following the comparator array can compensate for this effect. Basically, for each thermometer code, it takes 3 different thermometer code outputs that correspond to 3 consecutive levels. If the two higher levels are both a "0" and a "1" corresponds to the lowest level, then a new thermometer code "1" is generated corresponding to the lowest level only if the higher two levels are both "0". For example, Vn10, Vn9, and Vp8 will go to the same AND gate that generates a new thermometer code. In that case, when there is a bubble at Vp9, meaning Vp10=1 (Vn10=0), Vp9=0 (Vn9=1), and Vp8=1 (Vn8=0), the "1" at Vp8 will be discarded in order to remove the bubble at Vp9.

The analog comparator contains differential circuitry which needs to compare two different voltages. The closer these two voltages approach one another, the need of the differential circuit in the comparators to distinguish the small difference increases. Any non-uniformity in the differential circuit becomes more exposed during this critical distinction of the small voltage difference. A critical feature of maintaining uniformity is the matching of the transistors used in the differential circuit of the comparators. Transistor matching is a concern during the fabrication of the transistors since local topographical differences in the nearby environment of the transistor can affect the forming of the transistor. Ideally, the local topography should be the same for each transistor and one way of achieving this is to place dummy transistors besides active transistors so that the local environment appears to be the same for the active transistor. However, the dummy transistors use up area on the die and increase the size of the circuit thereby increasing the cost and because of the greater distances decreasing the performance. In place of the dummy transistors, the innovative step is to abut the differential transistors together such that the active transistor of one differential pair behaves as a dummy transistor for a second differential pair.

The following issues and trade-offs emerged during the design process: Mismatches $$\Delta V_{TH} = \frac{A_{VTH}}{\sqrt{WL}}, (A_{VTH} = 4 \sim 5 \text{ mV/um})$$

between transistors, especially input transistor pairs, will lead to false output of the comparator. The transistor has a width of W and a length of L. To keep the mismatch well below 0.2 LSB (~8 mV), with 60 nm channel length, a width greater than 8 um is necessary.

Figure 8C:
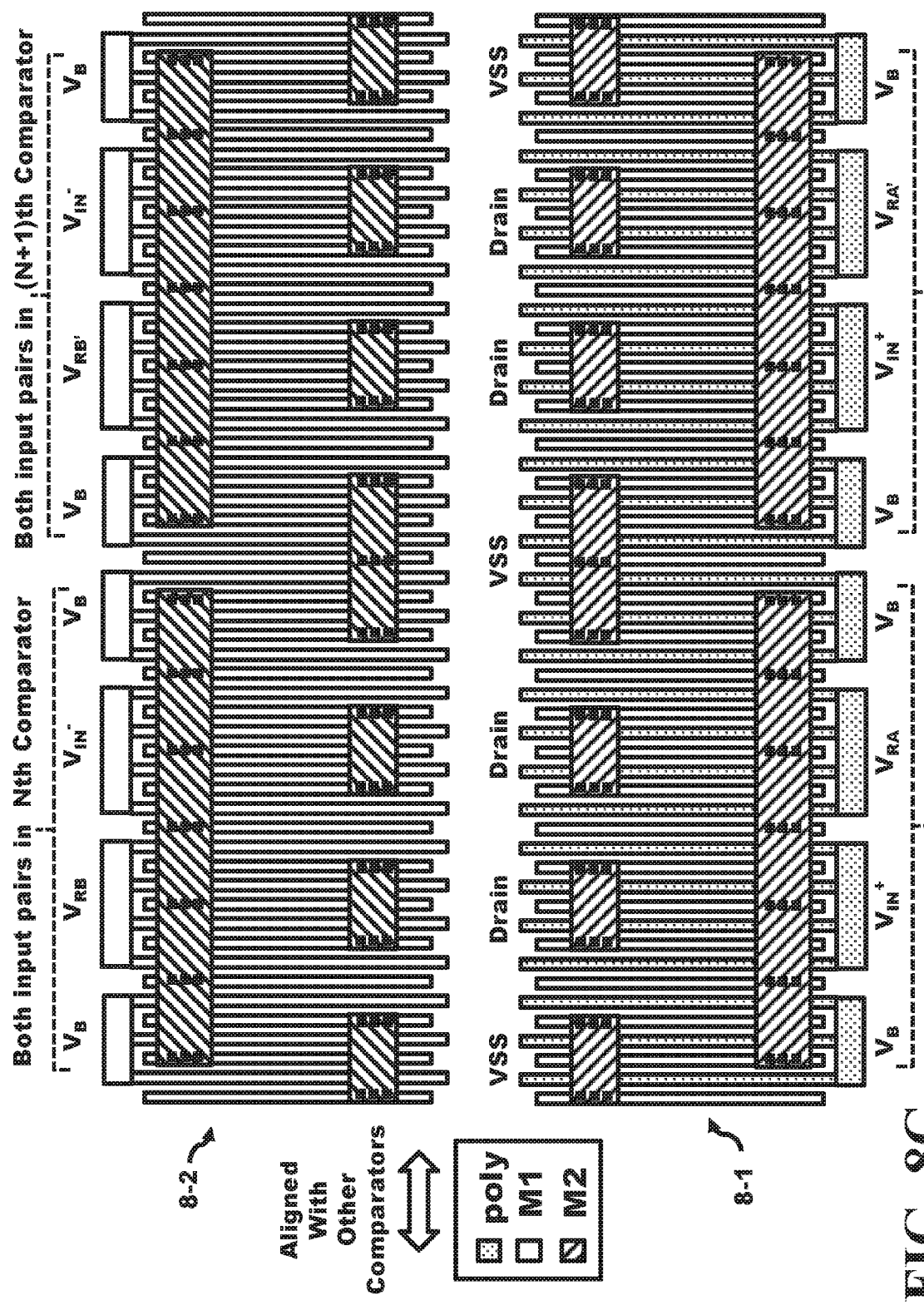
FIG. 8C depicts an inventive transistor layout of the current source and both input pairs of two comparators in accordance with the present invention.

The matching of transistors is better understood by the illustrations in FIG. 8A, FIG. 8B and FIG. 8C. FIGS. 8A and 8B show the layout of the input transistors and current sources of two comparators. FIG. 8A presents the layout using the conventional approach while FIG. 8B and FIG. 8C illustrate the layout of the embodiment with the inventive technique where the need for dummy transistors has been eliminated. This allows the transistors in both comparators of FIG. 8B and FIG. 8C to be tightly packed without gaps providing a uniform environment for local processing. In this way, not only are the mismatches between different comparators minimized, but the layout also becomes more compact, allowing shorter routing distances for both the signal and the clock.

FIG. 8A illustrates the layout of a first portion of the differential stage of the Nth comparator consisting of the current mirror driven by $V_B$ and a differential pair driven by $V_{IN+}$ and $V_{RA}$. The layout of a second portion of the differential stage of the [N+1]th comparator consisting of the current mirror driven by $V_B$ and a differential pair driven by $V_{IN+}$ and $V_{RA'}$. In order to ensure that all of the transistors operate the same, due to local environmental conditions on the integrated circuit, the dummy gates are inserted next to the active circuitry to topologically alter the surface and structure such that all transistors within the active circuitry area experience similar adjacent effects. However, these dummy gates use up valuable semiconductor area and cause the Nth comparator to be displaced farther from the [N+1]th comparator.

An inventive improvement is to remove the intervening dummy gates altogether and place each comparator next to one another such that the active transistor of the first differential stage becomes the dummy transistor for the second differential stage and vice versa. This is illustrated in FIG. 8B where now the first portion of the differential stage of the Nth comparator abuts the portion of the differential stage of the [N+1]th comparator. Now the active transistor of the Nth comparator is adjacent to the active transistor of the [N+1]th comparator removing the requirement for dummy transistors. This eliminates the waste in area, decreases any wiring channels for clocks and other signals, and improves the performance of the circuit.

The complete transistor circuit for the Nth and [N+1]th comparators is illustrated in FIG. 8C. The lower section 8-1 is identical to the layout illustrated in FIG. 8B. The upper section 8-2 illustrates the other differential stages in the pre-amplifier stage of the comparator. The drains of the corresponding transistors in the upper and lower sections are connected together using metal 3 ($M_3$) and is not shown. The metal 3 connection is well understood in the art and needs no further explanation. The left half presents the transistor layout of the Nth comparator including the input signals $V_B$, $V_{IN+}$, $V_{IN-}$, $V_{RA}$ and $V_{RB}$. The right half presents the transistor layout of the [N+1]th comparator including the input signals $V_B$, $V_{IN+}$, $V_{IN-}$, $V_{RA'}$, and $V_{RB'}$.

To reduce the mismatches within one comparator and between comparators, all input transistors and their currents sources are put right next to each other to serve as dummies of each other.

A folded resistor ladder is implemented to simplify routings from resistor ladder to the differential comparators, with the price being complicated routings to the bubble cancellation circuits. Comparators sit next to each other to share transistor dummy fingers.

Figure 9:
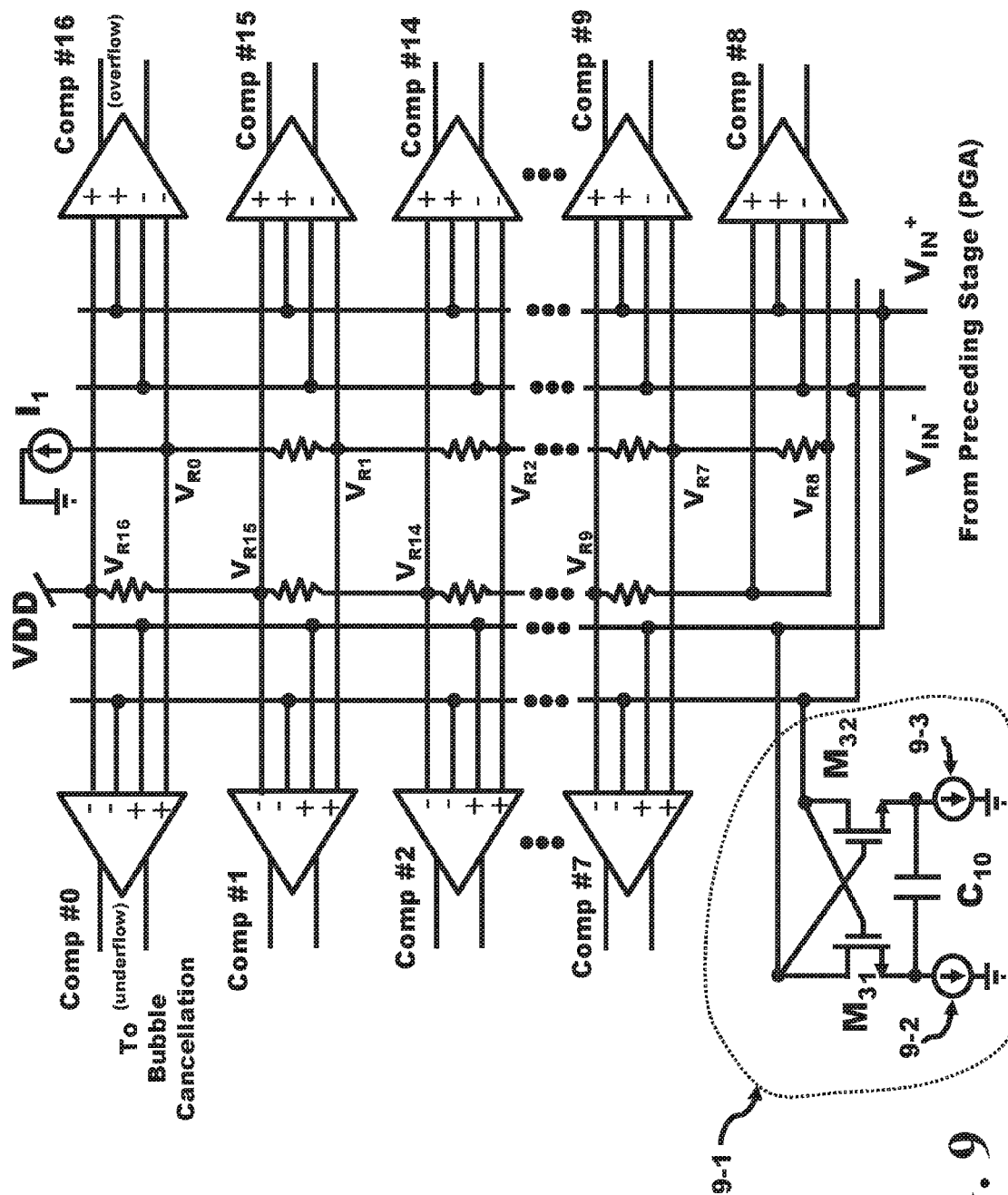
FIG. 9 illustrates a diagram of the resistor ladder and comparators with active negative-capacitance in accordance with the present invention.

FIG. 9 illustrates an innovative circuit to improve the signal bandwidth transfer between the proceeding programmable gain amplifier (PGA) to all differential inputs of the 17 comparators. The larger input gate transistor area helps to minimize the mismatch condition of the ADC comparator but introduces a larger input capacitance. An active negative-capacitor circuit is used to cancel the effect of the large input capacitance of the comparators. This active negative-capacitance basically is a cross-coupled N-channel pair with a capacitor coupling their sources together. The current in each N-channel transistor is carried by one current source. Each of the comparators present an input capacitance at its $V_{IN+}$ and $V_{IN-}$ nodes. In addition, each comparator occupies an area on the semiconductor die and this area usage is multiplied 17 times. Thus, a large overall area is involved and in order to propagate the output of the PGA signals to the input signals $V_{IN+}$ and $V_{IN-}$ of all 17 comparators, the input signal requires a trace or metal interconnect between the PGA and each comparator. The trace introduces a significant amount of capacitance and this capacitance adds to the input capacitance of the comparators. The differential interconnect includes a differential capacitive load comprising the capacitance of the interconnect, input capacitance of the comparators and the drain capacitances of the PGA. The overall capacitance causes the signal bandwidth to decrease in the interface circuitry between the PGA and the first stage of the comparator. This is a critical limiting feature for the performance of the system.

To overcome this short coming, the inventive cross coupled negative-capacitance circuit 9-1 of $M_{31}$ and $M_{32}$ illustrated in FIG. 9 has been developed. The drain terminals of M31 and $M_{32}$ are coupled to the nodes $V_{IN+}$ and $V_{IN-}$. The cross coupling circuit senses the transition of $V_{IN+}$ and $V_{IN-}$ and helps to speed up their transition or shorten the time period of the transfer. The performance is further improved by incorporating the two current sources 9-2 and 9-3 coupled to a supply, in this case a ground supply voltage or VSS. The capacitor $C_{10}$ helps to stabilize the voltages at the sources of the two transistors $M_{31}$ and $M_{32}$. Thereby, this circuit helps to speed up the transition and increases the bandwidth at this critical interface juncture between the output of the PGA and the inputs to the 17 comparators.

Figure 10A:
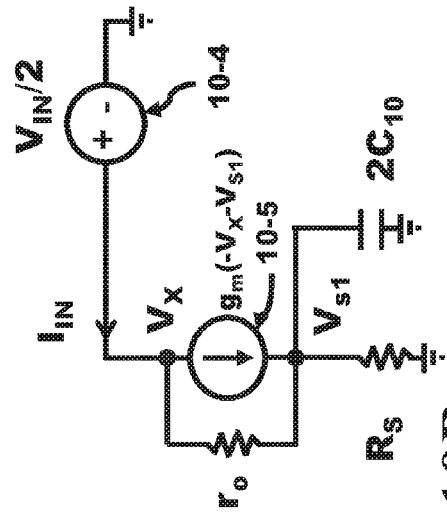
FIG. 10A depicts the equivalent circuit diagram of the active negative-capacitance in accordance with the present invention.
Figure 10B:
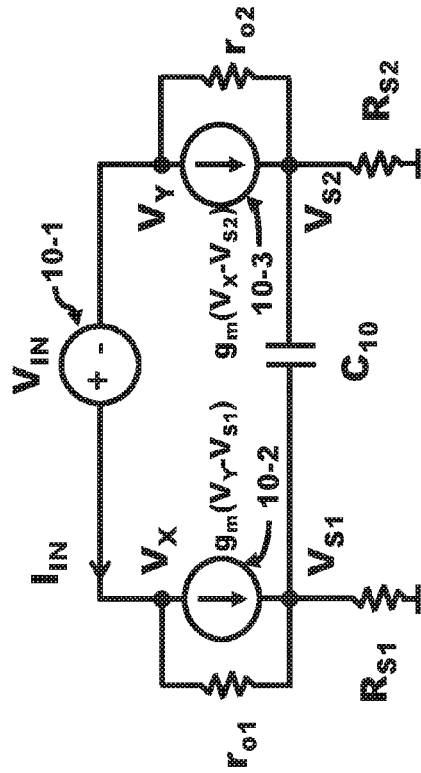
FIG. 10B illustrates the equivalent circuit diagram of the single-ended version of the active negative-capacitance in accordance with the present invention.

An equivalent circuit representation of the cross couple circuit is illustrated in FIG. 10A. The input to the circuit is the voltage source 10-1 which applies a current $I_{IN}$ to the left portion of the circuit representing the transistor 10-2 which has a $g_m(V_Y-V_{S1})$ and across this current source is an impedance of $r_{o1}$. The lower portion of the current source 10-2 is connected to $R_{S1}$ at node $V_{S1}$. The node $V_{S1}$ is coupled to node $V_{S2}$ via the capacitor $C_{10}$. On the right-hand side is the equivalent transistor of $M_{32}$ consisting of the current source 10-3 with a $g_m(V_X-V_{S2})$ and a resistor $r_{o2}$ in parallel. The top node $V_Y$ is connected to the negative terminal of the input voltage 10-1. The transconductance operates on difference of the opposite voltage in the opposing leg with regard to the voltage within its own leg. As this voltage difference increases, the transconductance increases helping to diminish the voltage difference thereby improving the bandwidth gain of this interface node. FIG. 10B illustrates the same circuit except the circuit is now single ended representation where now the current source 10-5 represents the transconductance gm($-V_X-V_{S1}$) and is in series with the voltage source 10-4 having a voltage of $V_{IN}/2$. The lower end of the current source 10-5 is coupled to ground via $R_S$ and capacitor $2C_{10}$.

By solving the small signal equivalent circuit in FIG. 10A, the assumption is that $r_{o1}=r_{o2}=r_0$, $R_{S1}=R_{S2}=R_S$, and $C_{10}=C$. The equivalent impedance looking into this circuit is:

$$\frac{Vin}{Iin}(s) = -\frac{2(ro + Rs + gm*ro*Rs + 2ro*Rs*sC)}{(gm*ro - 1)(2Rs*sC + 1)}$$

Neglecting current source impedance, we have:

$$\frac{Vin}{Iin}(s) = -\frac{gm*ro + 2ro*sC + 1}{sC(gm*ro - 1)}$$

If we further neglect the channel length modulation of input transistors, it becomes:

$$\frac{Vin}{Iin}(s) = -\frac{2}{gm} - \frac{1}{sC}$$

The last equation illustrates that the impedance is dependent on both the value of $g_m$ and C.

Figure 11:
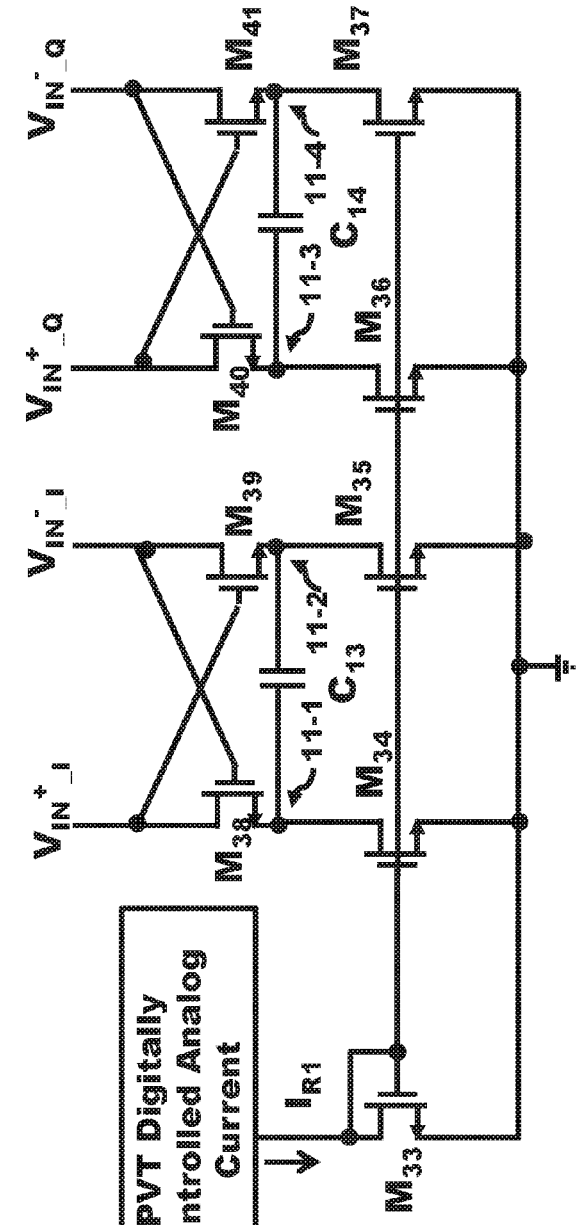
FIG. 11 shows a Process, Voltage and Temperature (PVT) current source applied to the active negative-capacitance of the in-phase I and quadrature phase Q channels in accordance with the present invention.

The cross couple negative-capacitance circuit is used twice within the chip as depicted in FIG. 11. The first negative-capacitance circuit is applied to the input voltages corresponding to the in-phase analog signals of $V_{IN+\_I}$ and $V_{IN-\_I}$ while the second negative-capacitance circuit operates on the quadrature-phase analog signals of $V_{IN+\_Q}$ and $V_{IN-\_Q}$. The two sets of input signals are provided by the differential outputs of two PGAs. The current source of the transistors is illustrated by transistor $M_{33}$ which is coupled to a process, voltage and temperature digitally controlled analog circuit which generates a current $I_{R1}$. This circuit can be completely analog controlled or completely digitally controlled but in this case it uses a combination of the two controls to achieve the desired value of $I_{R1}$. The current mirror $M_{33}$ applies the voltage to the gates of $M_{34}$, $M_{35}$, $M_{36}$ and $M_{37}$ providing a carefully controlled current being applied to the drains 11-1, 11-2, 11-3 and 11-4 of these transistors. $M_{38}$, $M_{39}$ and $C_{13}$ and $M_{40}$, $M_{41}$ and $C_{14}$ are coupled to these nodes as shown in FIG. 11. These two cross coupled negative-capacitance circuits improve the performance between the programmable gain amplifiers (PGA) and the inputs of their corresponding ADC's. A capacitor $C_{13}$ is placed between the sources of the first cross coupled circuit formed by $M_{38}$ and $M_{39}$ while capacitor $C_{14}$ is placed between the sources of the second cross coupled circuit formed by $M_{40}$ and $M_{41}$. Although not shown, each of the individual cross couple circuits can be controlled by separate and distinct analog control or current mirrors to perform additional functions if so desired.

Figure 12:
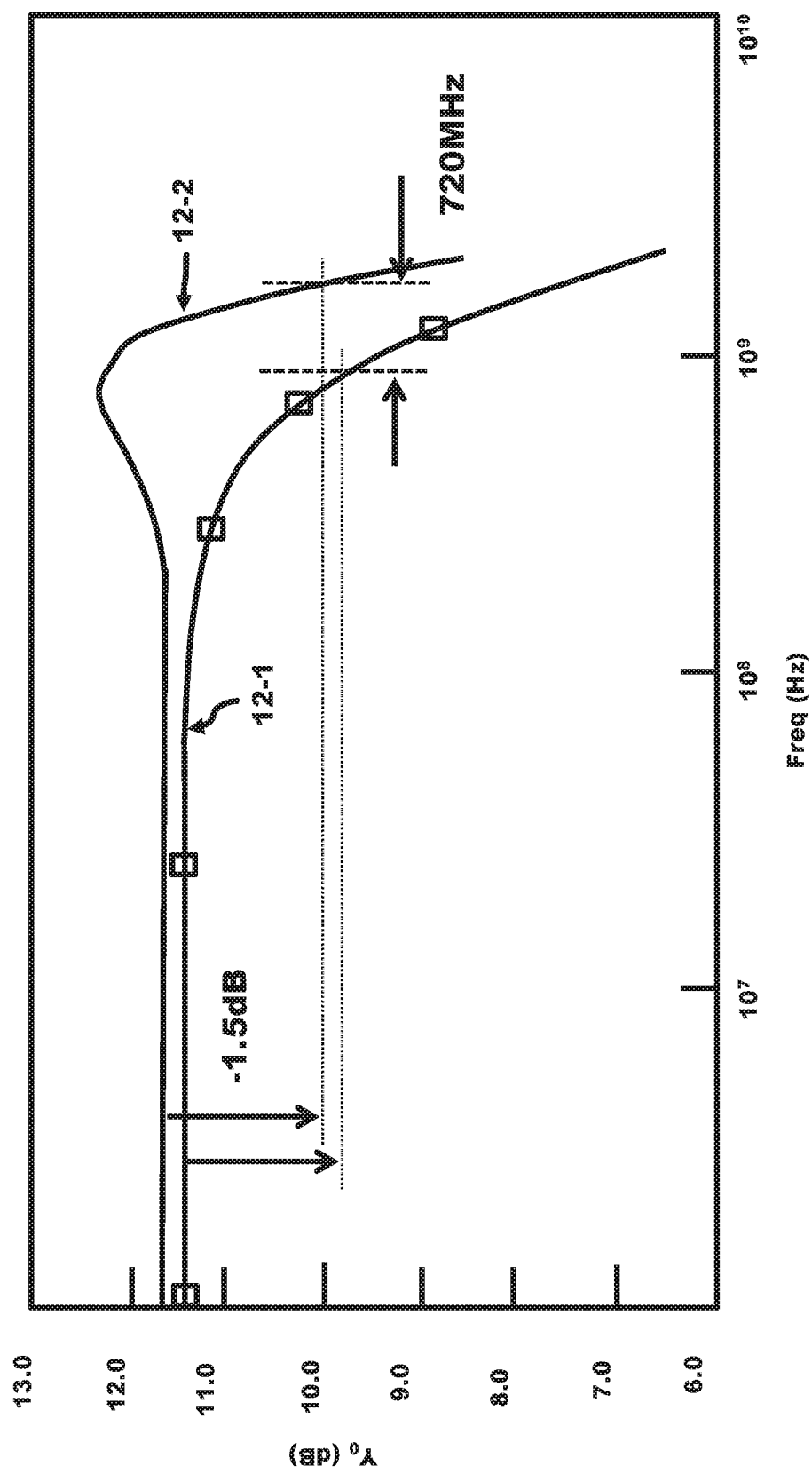
FIG. 12 presents a plot of the frequency response of the PGA and ADC with and without the active negative-capacitance circuit in accordance with the present invention.

In FIG. 12, the response at the output of the PGA driving 17 comparators without the use of the innovative cross couple transistor is illustrated by the curve 12-1 and is measured with the squares. This curve has a cut off frequency of about 0.88 GHz. When the innovative cross couple circuit is used, the curve 12-2 illustrates the response of the circuit between the output of the programmable gain amplifier and the 17 comparators. The curve shows a peaking of the response which pushes out the bandwidth of the circuit 720 MHz to about 1.6 GHz. The gain at the 1.5 DB points between both curves is depicted. This provides an improved performance at this critical interface. Thus, the signal bandwidth between the PGA and the ADC has improved by 720 MHz.

In this design, although the ADC itself has a 1 dB bandwidth approximately 1.3 GHz (post-layout simulation), the bandwidth of the PGA drops dramatically (2.6 dB drop at 880 MHz) when driving 17 comparators directly. There is a negative-capacitive component in this equivalent impedance, which can be used to cancel the effect of the input capacitance of ADC and increase the bandwidth. FIG. 12 shows the effect of the negative-capacitance circuit in simulation. The 1.5 dB bandwidth of PGA increases from less than 880 MHz to 1.6 GHz with the help of the negative-capacitance circuit.

A summary of some of the inventive apparatus for a clock-less pre-amplifier system is provided.

A comparator apparatus comprising a first clock-less pre-amplifier stage, a capture stage coupled to the first clock-less pre-amplifier stage and a memory regeneration stage coupled to the capture stage, whereby the capture stage receives a reset and pass signals to transfer data from the first clock-less pre-amplifier stage to the memory regeneration stage. At least one buffer is coupled to the memory regeneration stage and a latching memory stage is coupled to the buffer. A reset pulse generator creates the reset and pass signals. A clock enables the memory regeneration stage and the clock also enables the reset pulse generator. A first differential stage of a first clock-less pre-amplifier stage is abutted to a second differential stage of a second clock-less pre-amplifier stage such that an active transistor of the first differential stage behaves as a dummy transistor for an active transistor of the second differential stage. The first clock-less pre-amplifier comprises: a first load coupled to a first output of a first and a second differential stage, a second load coupled to a second output of the first and the second differential stage, a first input signal and a first input reference signal coupled to the first differential stage and a second input signal and a second input reference signal coupled to the second differential stage where load can be a resistive load.

An apparatus comprising a first load coupled to a first output of a first and a second differential stage, a second load coupled to a second output of the first and the second differential stage, a first input signal and a first input reference signal coupled to the first differential stage, a second input signal and a second input reference signal coupled to the second differential stage, the first output coupled to a third output by a first pass transistor, the second output coupled to a fourth output by a second pass transistor and the third output coupled to the fourth output by a reset transistor. The third and the fourth output are coupled to a memory regeneration stage and the memory regeneration stage is coupled to at least one buffer. A third differential stage is abutted to the second differential stage such that an active transistor of the third differential stage behaves as a dummy transistor for an active transistor in the second differential stage. A latching memory stage is coupled to the buffer. The first and second pass transistors receive a pass signal to transfer data from the first and the second output to the memory regeneration stage. The reset transistor receives a reset signal to initialize the third and the fourth output coupled to the memory regeneration stage.

A method of minimizing clock kick-back comprising the steps of coupling a first output of a first clock-less pre-amplifier stage to a first pass transistor, coupling a second output of the first clock-less pre-amplifier stage to a second pass transistor, coupling the first pass transistor to a first input of a memory regeneration stage, coupling the second pass transistor to a second input of the memory regeneration stage, coupling a reset transistor between the first and second inputs of the memory regeneration stage, enabling the first and second pass transistor within a time window and adjusting the reset transistor within the time window to reduce the clock kick-back, thereby minimizing the clock kick-back. The memory regeneration stage is coupled to at least one buffer. The method includes abutting a second clock-less pre-amplifier stage to the first clock-less pre-amplifier stage such that an active transistor of a first differential stage in the first clock-less pre-amplifier stage behaves as a dummy transistor for an active transistor of a first differential stage in the second clock-less pre-amplifier and coupling a latching memory stage to the buffer. The first and second pass transistors receive a pass signal to transfer data from the first output and the second output to the memory regeneration stage. The reset transistor receives a reset signal to initialize the first and the second output of the memory regeneration stage.

A summary of some of the inventive apparatus for a negative-capacitance system is provided.

A negative-capacitance apparatus comprising a first node coupled to a drain of a first transistor and a gate of a second transistor, a second node coupled to a drain of the second transistor and a gate of the first transistor, a capacitor coupled between a source of the first transistor and a source of the second transistor, a first current mirror coupled between a supply voltage and the source of the first transistor and a second current mirror coupled between the supply voltage and the source of the second transistor. The apparatus also includes a first amplifier that generates a differential signal coupled to the first and second nodes. The first amplifier can be a programmable gain amplifier. The apparatus also comprises a plurality of amplifiers that are driven by the differential signal coupled to the first and second node. Each of the plurality of amplifiers comprises a pre-amplifier of a comparator. A coupling is formed between the first amplifier and the plurality of amplifiers. The pre-amplifier of the comparator is a clock-less pre-amplifier. The pre-amplifier stages are abutted to one another such that an active transistor of a first differential stage in a first pre-amplifier stage behaves as a dummy transistor for an adjacent differential stage in a second pre-amplifier stage.

A method of increasing a transfer bandwidth of a differential signal comprising the steps of amplifying a differential input signal to provide the differential signal driving a differential capacitive load between a first and a second node, coupling the first node to a drain of a first transistor and a gate of a second transistor, coupling the second node to a drain of the second transistor and a gate of the first transistor, coupling a capacitor between a source of the first transistor and a source of the second transistor, coupling a first current mirror between a supply voltage and the source of the first transistor, coupling a second current mirror between the supply voltage and the source of the second transistor and causing the differential capacitive load to be driven in a shorter time period, thereby increasing the transfer bandwidth of the differential signal. A first amplifier generates the differential input signal and a plurality of amplifiers receives the differential input signal. The differential capacitive load comprises a differential capacitance of a differential interconnect, a differential input capacitance of the plurality of amplifiers and a differential drain capacitance of the first amplifier. The first amplifier is a programmable gain amplifier. Each of the plurality of amplifiers is clock-less pre-amplifier of a comparator. The method includes abutting a plurality of clock-less pre-amplifier stages to one another such that an active transistor of a first differential stage in a first clock-less pre-amplifier stage behaves as a dummy transistor for an adjacent differential stage in a second clock-less pre-amplifier stage.

An apparatus comprising a first amplifier coupled to a first and a second node, a differential capacitive load coupled to the first and the second node, the differential capacitive load coupled between drains of transistors in a cross coupled transistor circuit, a current source coupled to a source of each transistor and a capacitor coupled between the sources of the transistors. The apparatus also includes a plurality of amplifiers coupled to the first and the second node and a differential signal of the first amplifier drives the first and the second node. Each of the plurality of amplifiers is a clock-less pre-amplifier of a comparator. The first amplifier is a programmable gain amplifier. The pre-amplifier stages are abutted to one another such that an active transistor of a first differential stage in a first pre-amplifier stage behaves as a dummy transistor for an adjacent differential stage in a second pre-amplifier stage.

Finally, it is understood that the above descriptions are only illustrative of the principle of the current invention. Various alterations, improvements, and modifications will occur and are intended to be suggested hereby, and are within the spirit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. For example, the circuits have a Doctrine of Equivalents, that is, P-channels transformed into N-channels, VDD interchanges with VSS, voltages measured with respect to the other power supply, the position of current sources moved to the other power supply, etc. The semiconductor die can include silicon, germanium, SI graphite, GaAs, SIO, etc. Although the circuits were described using CMOS, the same circuit techniques can be applied to depletion mode transistors and BJT or biploar circuits, since this technology allows the formation of current sources and source followers. When a transistor is specified, the transistor can be a transistor such as an N-MOS or P-MOS. The CMOS or SOI (Silicon on Insulator) technology provides two enhancement mode channel types: N-MOS (N-channel) and P-MOS (P-channel) transistors or transistors. In addition, a network and a portable system can exchange information wirelessly by using communication techniques such as Time Division Multiple Access (TDMA), Frequency Division Multiple Access (FDMA), Code Division Multiple Access (CDMA), Orthogonal Frequency Division Multiplexing (OFDM), Ultra Wide Band (UWB), Wi-Fi, WiGig, Bluetooth, etc. The network can comprise the phone network, IP (Internet protocol) network, Local Area Network (LAN), ad hoc networks, local routers and even other portable systems.

What is claimed is:

1. A method for producing a circuit, comprising:
   coupling a first amplifier to a differential capacitive load;
   coupling the differential capacitive load between drains of transistors in a cross coupled transistor circuit;
   coupling a current mirror to a source of each transistor; and
   coupling a capacitor between sources of the transistors, thereby counteracting performance degradation due to the differential capacitive load on the first amplifier.

2. The method recited in claim 1, further comprising coupling a plurality of amplifiers to the differential capacitive load.

3. The method recited in claim 2, further comprising driving a differential signal of the first amplifier.

4. The method recited in claim 3, wherein each of the plurality of amplifiers comprises a clock-less pre-amplifier of a comparator.

5. The method recited in claim 1, wherein the first amplifier is a programmable gain amplifier.

6. The method recited in claim 2, wherein the plurality of amplifiers comprises amplifiers that are abutted to one another such that an active transistor of a first differential stage in at least one amplifier behaves as a dummy transistor for an adjacent differential stage in another amplifier.

* * * * *